(12) United States Patent
Taniguchi et al.

(10) Patent No.: US 6,225,843 B1
(45) Date of Patent: May 1, 2001

(54) SEMICONDUCTOR INTEGRATED CIRCUIT DEVICE

(75) Inventors: Nobutaka Taniguchi; Hiroyoshi Tomita, both of Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 09/385,005

(22) Filed: Aug. 27, 1999

(30) Foreign Application Priority Data

Nov. 20, 1998 (JP) ................................................. 10-331566

(51) Int. Cl.[7] ........................................................ H03L 7/00

(52) U.S. Cl. ........................... 327/158; 327/156; 327/149; 327/237; 327/236; 327/270

(58) Field of Search ..................................... 327/159, 236, 327/237, 244, 245, 149, 270, 156, 158

(56) References Cited

U.S. PATENT DOCUMENTS 5,955,904 * 9/1999 Kawasaki .............................. 327/158

* cited by examiner

*Primary Examiner*—Dinh T. Le
(74) *Attorney, Agent, or Firm*—Arent Fox Kintner Plotk & Kahn, PLLC

(57) ABSTRACT

A semiconductor integrated circuit device includes a first delay circuit delaying a first clock signal, a second delay circuit delaying a second clock signal which has an inverted phase with respect to the first clock signal, a phase comparator outputting a phase error signal based on a comparison of the first clock signal and a feedback signal corresponding to an output signal from the first delay circuit, a delay control circuit generating a delay control signal based on the phase error signal, for variably controlling a delay quantity of the first and second delay circuits, and a timing adjusting circuit variably controlling a delay quantity of the second delay circuit by supplying the delay control signal to the second delay circuit at a timing synchronized to the second clock signal.

6 Claims, 30 Drawing Sheets

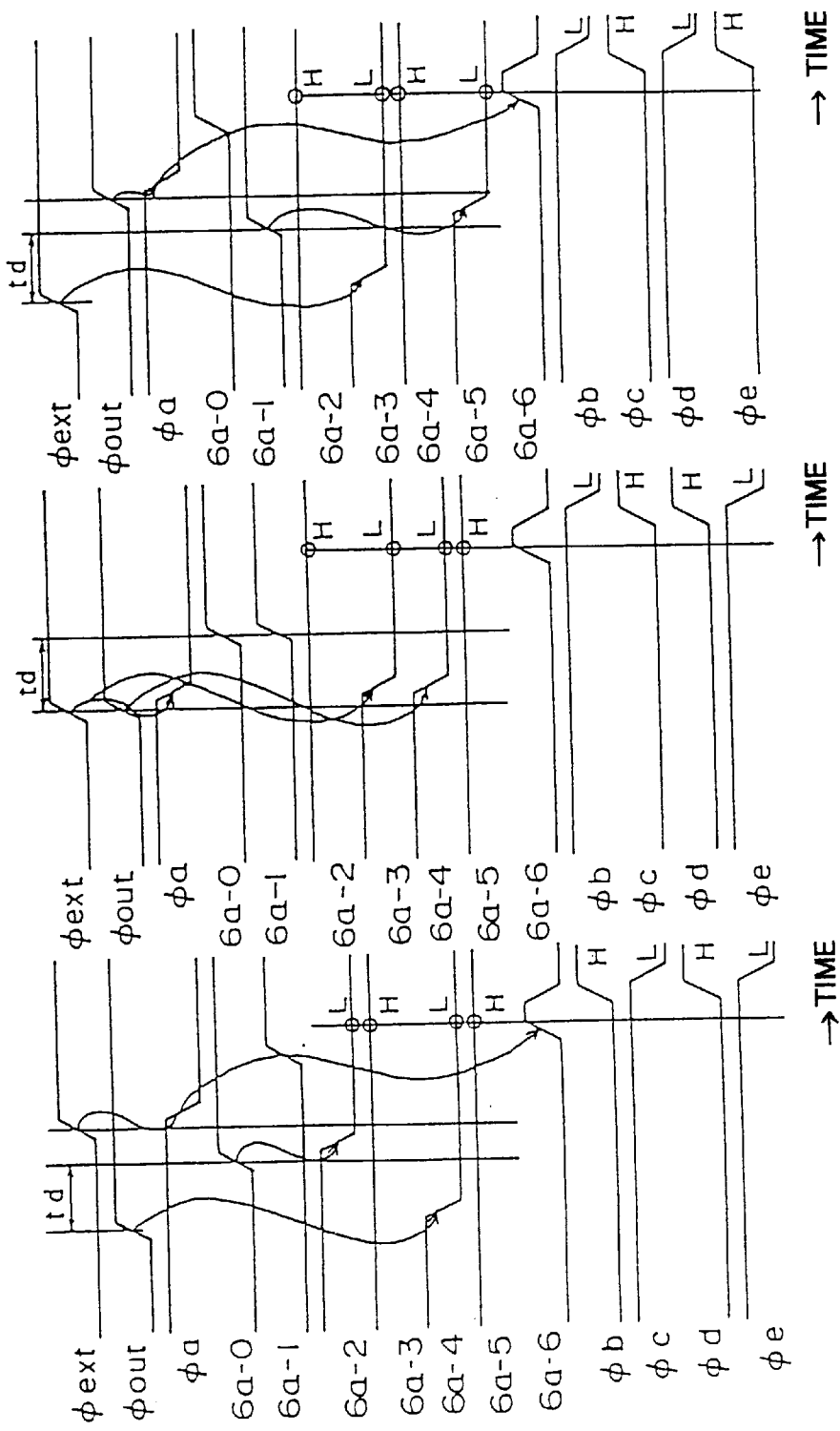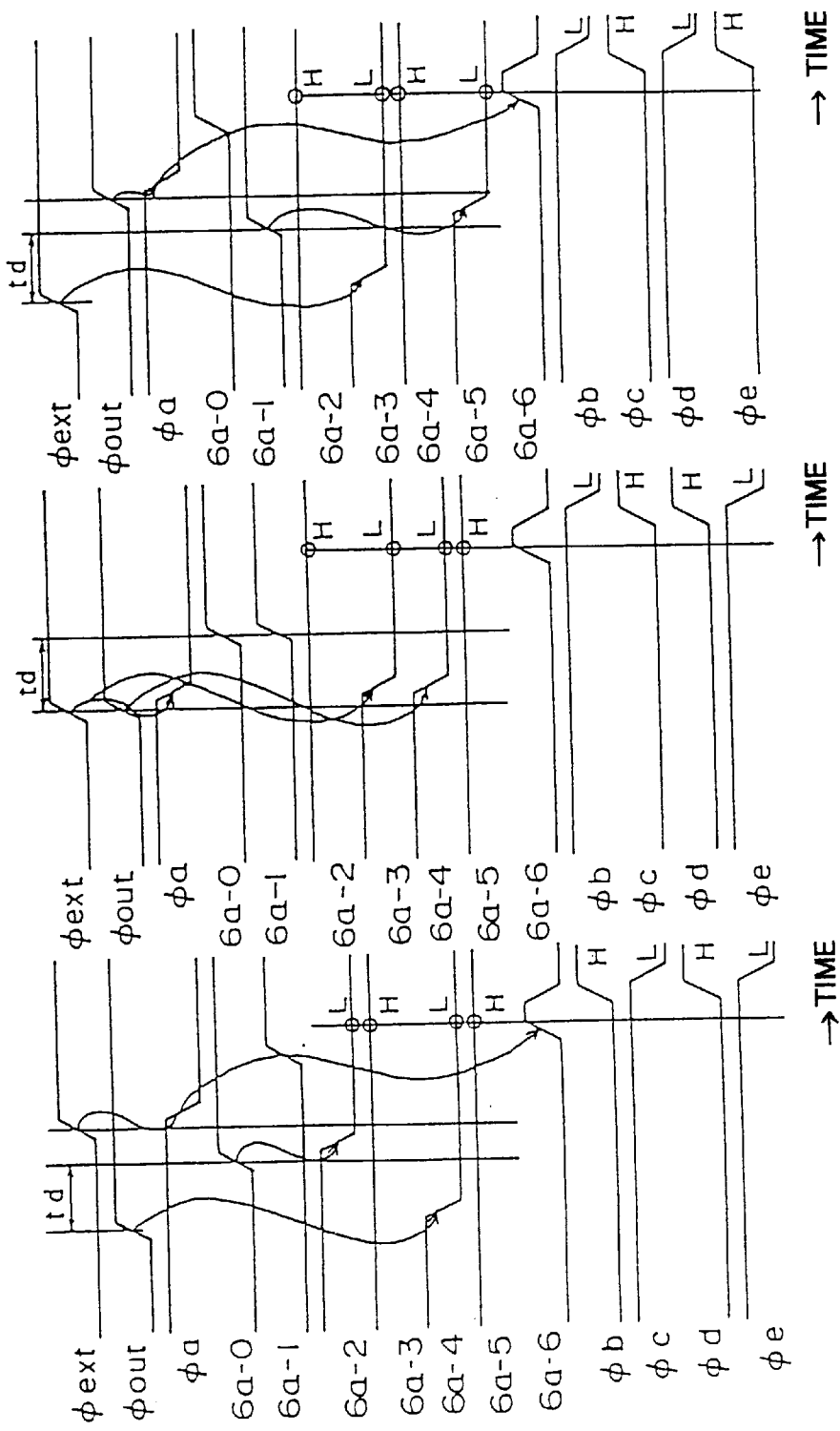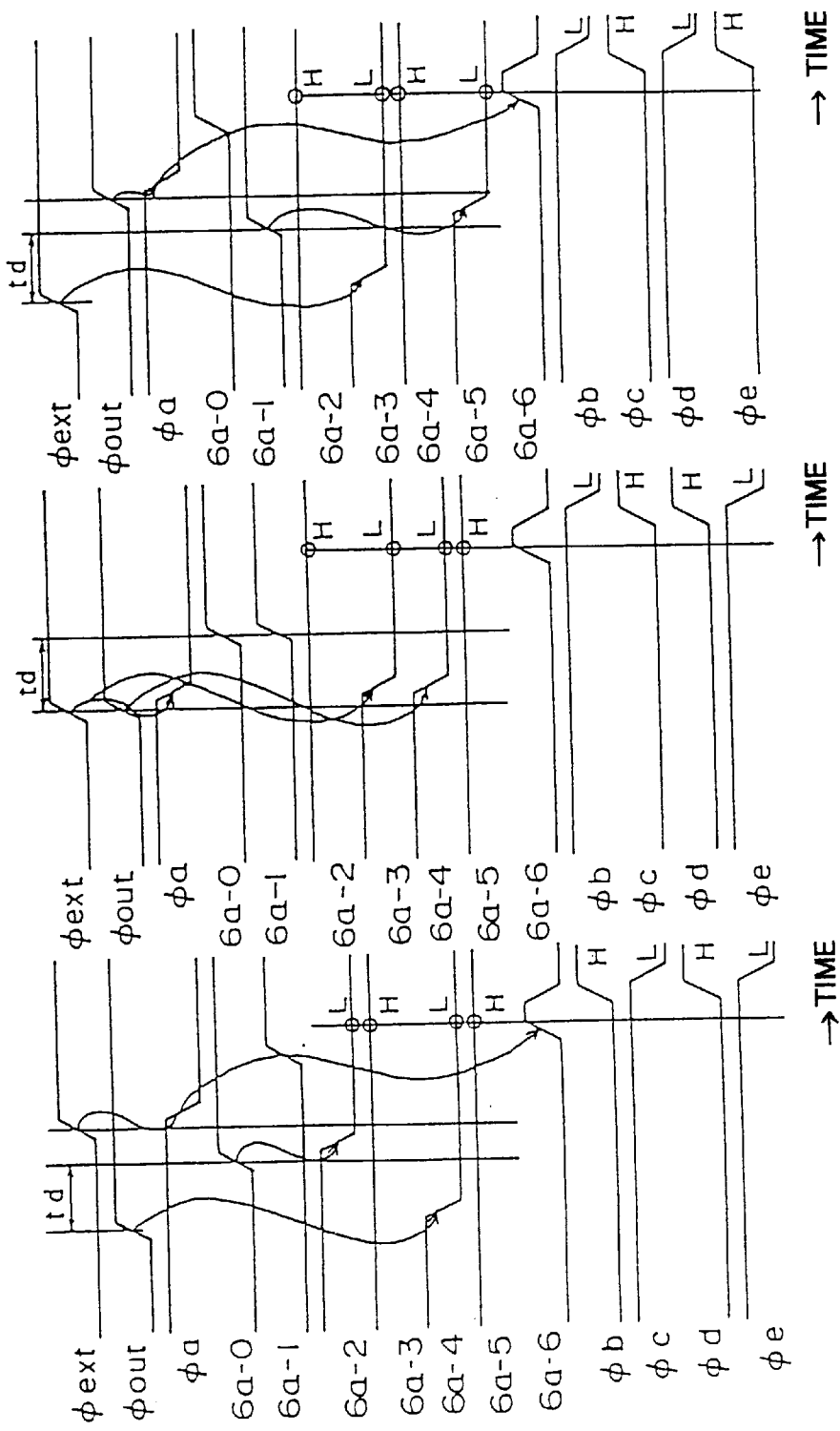

FIG. 17A

COUNTER

| SHIFT INSTRUCTION | N11 | N12 | N13 | N14 | N15 | N16 |
|---|---|---|---|---|---|---|
| | L | L | L | L | L | L |
| UP | H | L | L | L | L | L |
| UP | H | H | L | L | L | L |
| UP | H | H | H | L | L | L |
| UP | H | H | H | H | L | L |
| DOWN | H | H | H | L | L | L |
| DOWN | H | H | L | L | L | L |

FIG. 17B

OUTPUT OF DELAY CONTROL CIRCUIT

| SE1 | SE2 | SE3 | SE4 | SE5 | SE6 |
|---|---|---|---|---|---|
| H | L | L | L | L | L |
| H | H | L | L | L | L |
| L | H | H | L | L | L |
| L | L | H | H | L | L |
| L | L | L | H | H | L |
| L | L | H | H | L | L |
| L | H | H | L | L | L |

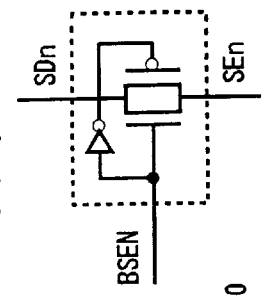
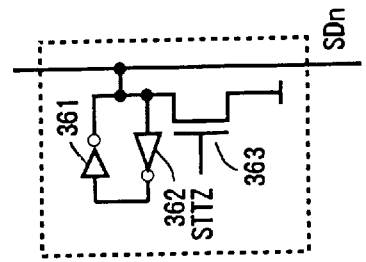
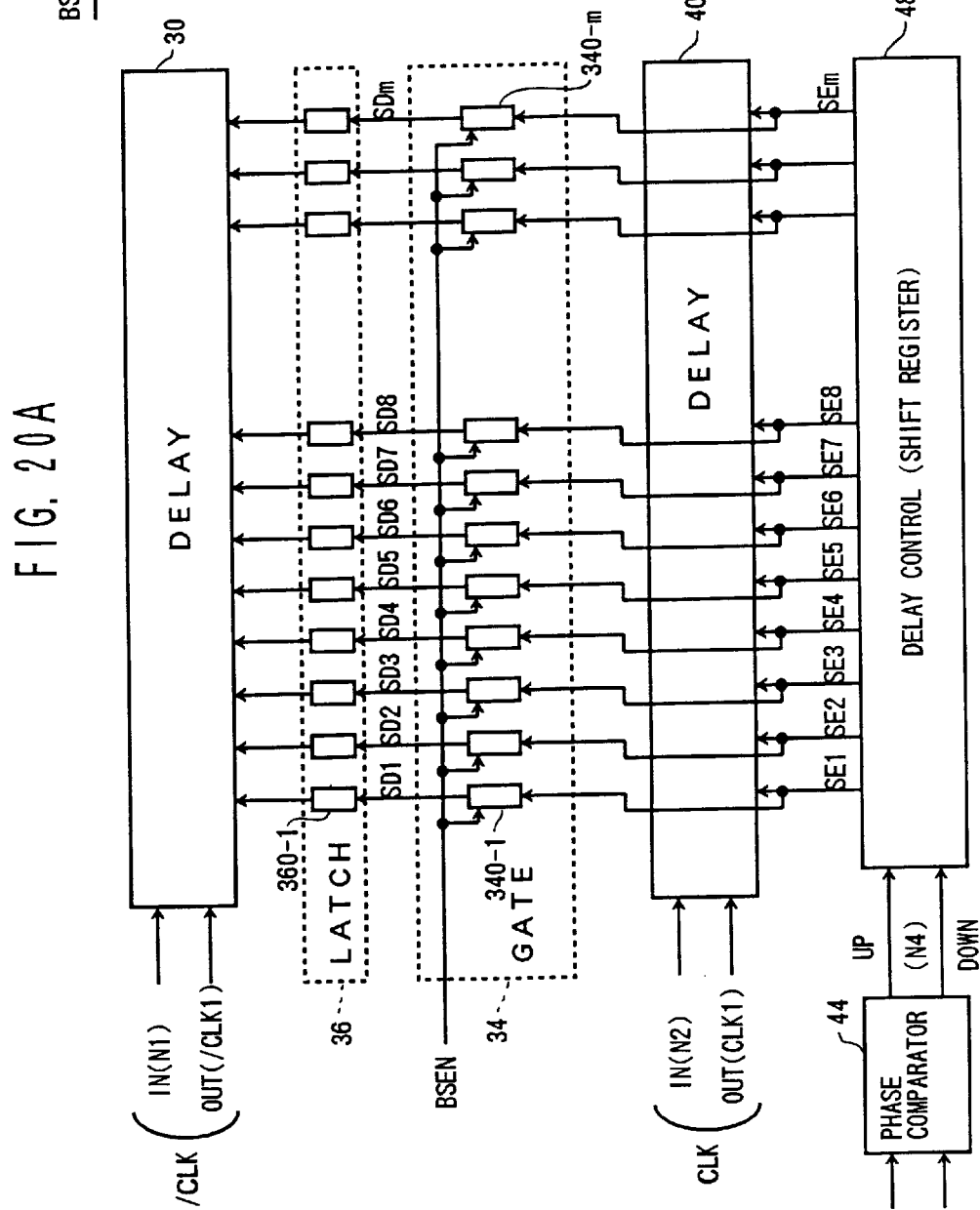

| SE | n−3 | n−2 | n−1 | n | n+1 | n+2 | n+3 |
|---|---|---|---|---|---|---|---|
| | L | L | L | H | H | L | L |
| SW1 | OFF | OFF | ON | ON | ON | ON | OFF |

SEMICONDUCTOR INTEGRATED CIRCUIT DEVICE

BACKGROUND OF THE INVENTION

1. Field of the Invention

The present invention generally relates to semiconductor integrated circuit devices, and more particularly to a semiconductor integrated circuit device having a Delayed Locked Loop (DLL) circuit.

Recently, both the operation speed and integration density of semiconductor integrated circuit devices have increased considerably, and it has become necessary to supply phase-synchronized clock signals to predetermined circuits within the semiconductor integrated circuit devices. More particularly, in a Synchronous Dynamic Random Access Memory (SDRAM), a DLL circuit is used to supply a clock signal which is phase-synchronized to an external clock signal to a plurality of output buffer circuits. In order for the DLL circuit to cope with a high-frequency clock signal, it is necessary to use a digital DLL circuit which operates at a high precision.

2. Description of the Related Art

FIG. 1 is a system block diagram showing an example of a conventional DLL circuit. In FIG. 1, external clock signals /CLK and CLK having mutually inverted phases are respectively input to input terminals 150 and 151, and supplied to delay circuits 154 and 155 via input buffers 152 and 153. In addition, the external clock signal CLK output from the input buffer 153 is supplied to a phase comparing section 157 within a phase comparator 156, as a reference clock.

The external clock signal CLK output from the input buffer 153 is passed through the delay circuit 155, a dummy output buffer 160 and a dummy input buffer 161 and delayed, before being supplied to the phase comparing section 157. The dummy output buffer 160 has the same circuit construction as an output buffer 162, and the dummy input buffer 161 has the same circuit construction as the input buffers 152 and 153. The phase comparing section 157 compares phases of the clock signal which is delayed by the dummy input buffer 161 and the reference clock (clock signal CLK), and generates a phase error signal at the timing of a rising edge of the clock signal CLK. This phase error signal is supplied to delay control circuits 164 and 165 via respective amplifier sections 158 and 159. The amplifier section 158 synchronizes the phase error signal to the timing of a rising edge of the clock signal /CLK.

The delay control circuit 165 controls a delay quantity of the delay circuit 155 so as to eliminate the phase error, based on the phase error signal. Hence, the delay quantity of the delay circuit 155 is variably controlled so that the rising edge of the delayed clock signal matches the rising edge of the reference clock, that is, so that the delayed clock signal is delayed by a quantity corresponding to k periods of the external clock signal with respect to the reference clock. The constructions of the delay control circuit 164 and the delay circuit 154 respectively are the same as the constructions of the delay control circuit 165 and the delay circuit 155. The delay control circuit 164 similarly controls a delay quantity of the delay circuit 154 so as to eliminate the phase error, based on the phase error signal. As a result, the clock signals /CLK and CLK which are mutually inverted and delayed by the respective delay circuits 154 and 155 are supplied to the output buffer 162.

The output buffer 162 reads data in synchronism with the rising edges of the clock signals /CLK and CLK which have the mutually inverted phases. For this reason, in order to prevent noise from being generated at the rising edges of the clock signals /CLK and CLK, the delay control circuit 165 variable controls the delay quantity of the delay circuit 155 during a time t1 with respect to the clock signal CLK shown in FIG. 2(a), and the delay control circuit 164 variably controls the delay quantity of the delay circuit 154 during a time t2 with respect to the clock signal /CLK shown in FIG. 2(b). The amplifier section 158 synchronizes the timing of the phase error signal to the rising edge of the clock signal /CLK, so that the variably controlling timings of the delay control circuits 164 and 165 differ.

A DRAM (not shown) which supplies a read data DATA to the output buffer 162 carries out a high-speed access so that an apparent data read speed is doubled by reading the data in synchronism with each of two clock signals having mutually inverted phases. The output buffer 162 carries out a buffering operation with respect to the data on a data bus (not shown), in synchronism with the supplied clock signals /CLK and CLK and outputs a buffered data $D_{OUT}$ via a data output terminal 166.

But according to the conventional DLL circuit shown in FIG. 1, it is necessary to provide the delay control circuits 164 and 165 respectively with respect to the delay circuits 154 and 155, and there are problems in that a circuit scale and a required chip area of the DLL circuit become large.

SUMMARY OF THE INVENTION

Accordingly, it is a general object of the present invention to provide a novel and useful semiconductor integrated circuit device in which the problems described above are eliminated.

Another and more specific object of the present invention is to provide a semiconductor integrated circuit device which can prevent an increase of a chip area, and is capable of generating clocks having phases of rising edges accurately differing by 180 degrees and inverted clocks thereof.

Still another object of the present invention is to provide a semiconductor integrated circuit device comprising a first delay circuit delaying a first clock signal, a second delay circuit delaying a second clock signal which has an inverted phase with respect to the first clock signal, a phase comparator outputting a phase error signal based on a comparison of the first clock signal and a feedback signal corresponding to an output signal from the first delay circuit, a delay control circuit generating a delay control signal based on the phase error signal, for variably controlling a delay quantity of the first and second delay circuits, and a timing adjusting circuit variably controlling a delay quantity of the second delay circuit by supplying the delay control signal to the second delay circuit at a timing synchronized to the second clock signal. According to the semiconductor integrated circuit of the present invention, it is possible to variably control the delay quantities of the first and second delay circuits with optimum timings by use of a single delay control circuit. For this reason, it is possible to prevent the circuit scale and the chip area from increasing, and generate a clock signal and an inverted clock signal which have phases which accurately differ by 180 degrees.

Other objects and further features of the present invention will be apparent from the following detailed description when read in conjunction with the accompanying drawings.

BRIEF DESCRIPTION OF THE DRAWINGS

FIGS. 8A, 8B and 8C are timing charts for explaining the operation of the phase comparing section shown in FIG. 7;

FIGS. 17A and 17B are diagrams for explaining the operation of the delay control circuit shown in FIG. 16;

FIGS. 20A, 20B and 20C are diagrams for explaining an embodiment of a gate circuit and a latch circuit;

DESCRIPTION OF THE PREFERRED EMBODIMENTS

Figure 1:
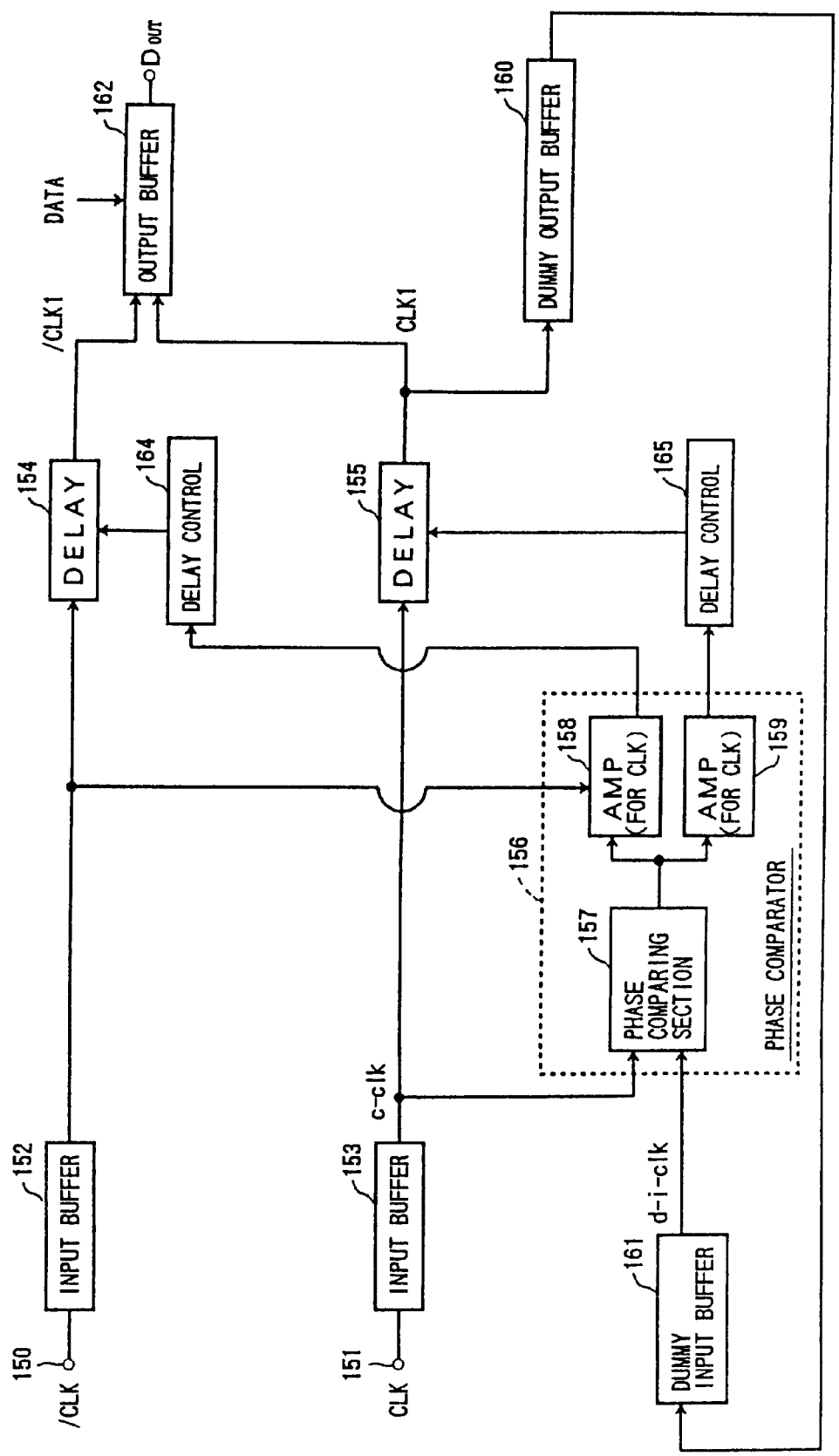
FIG. 1 is a system block diagram showing an example of a conventional DLL circuit.
Figure 2:
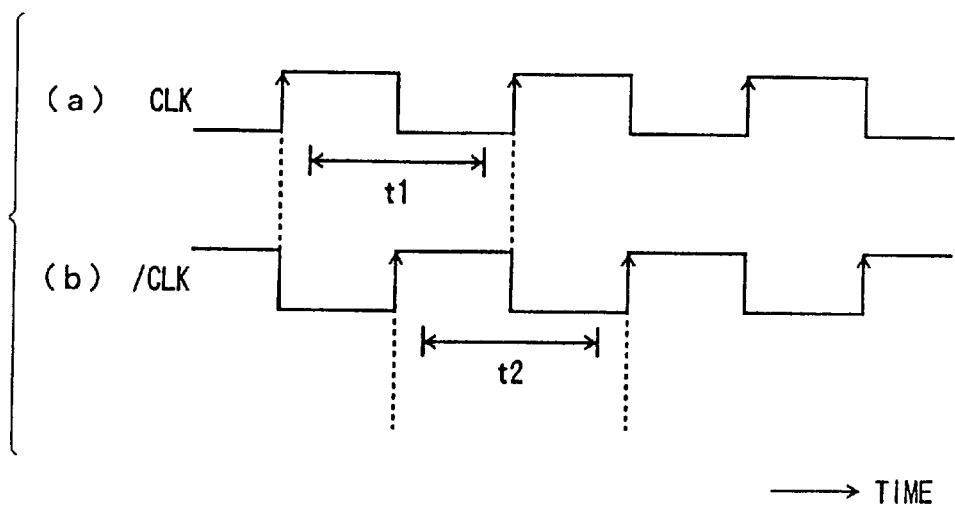
FIGS. 2(a) and 2(b) are signal waveforms for explaining the operation of the conventional DLL circuit shown in FIG. 1.
Figure 3:
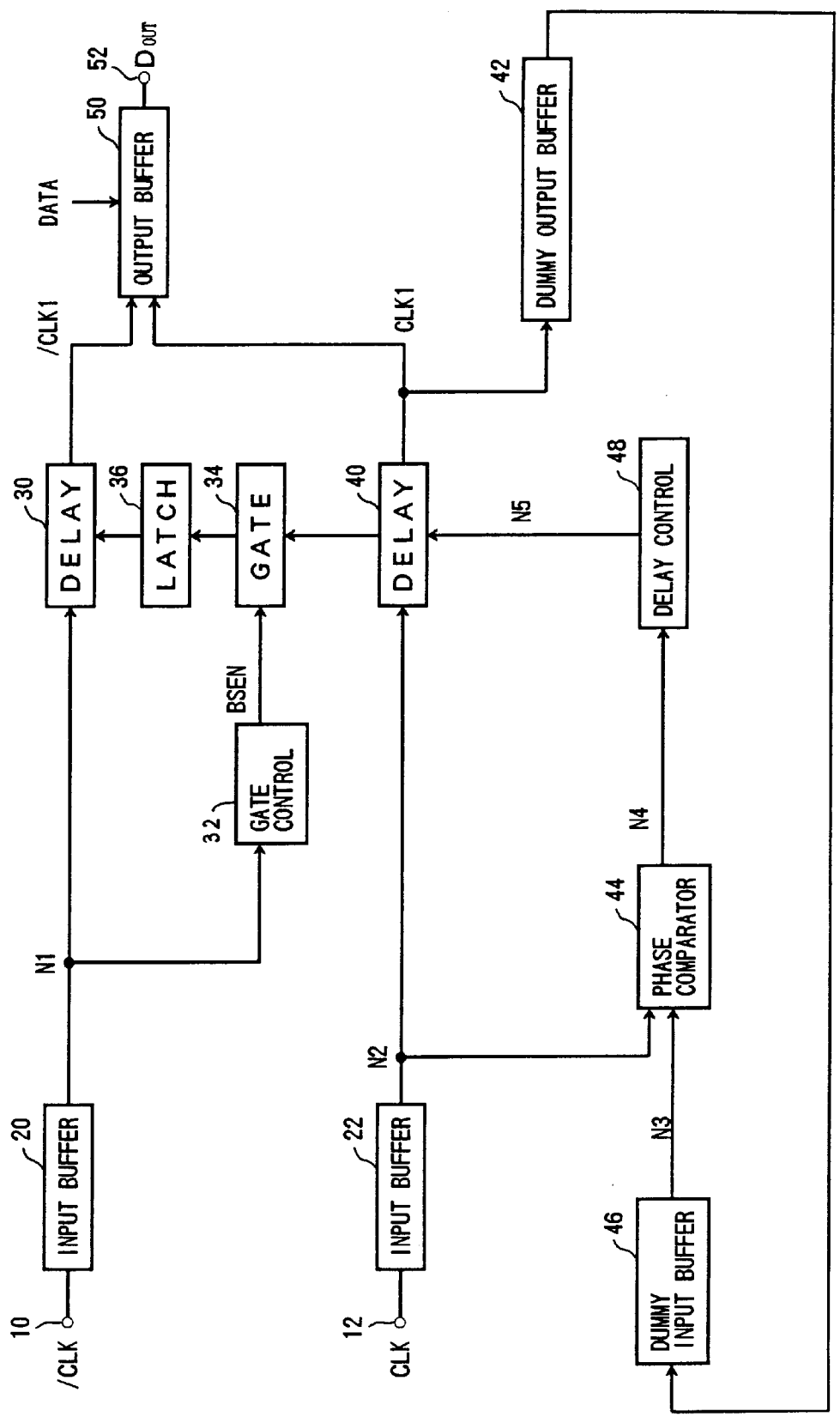
FIG. 3 is a system block diagram showing a first embodiment of a semiconductor integrated circuit device according to the present invention.

FIG. 3 is a system block diagram showing a first embodiment of a semiconductor integrated circuit device according to the present invention. More particularly, FIG. 3 shows a DLL circuit of this first embodiment.

In FIG. 3, external clock signals /CLK and CLK having mutually inverted phases are respectively input to input terminals 10 and 12, and supplied to delay circuits 30 and 40 via input buffers 20 and 22. In addition, the external clock signal /CLK output from the input buffer 20 is supplied to a gate control circuit 32, and the external clock signal CLK output from the input buffer 22 is supplied to a phase comparator 44 as a reference clock.

The external clock signal CLK output from the input buffer 22 is passed through the delay circuit 40, a dummy output buffer 42 and a dummy input buffer 46 and delayed, before being supplied to the phase comparator 44. The dummy output buffer 42 has the same circuit construction as an output buffer 50, and the dummy input buffer 46 has the same circuit construction as the input buffers 20 and 22. The phase comparator 44 compares phases of the clock signal which is delayed by the dummy input buffer 46 and the reference clock (clock signal CLK) from the input buffer 22, and generates a phase error signal at the timing of a rising edge of the clock signal CLK. This phase error signal is supplied to a delay control circuit 48.

The delay control circuit 48 controls a delay quantity of the delay circuit 40 so as to eliminate the phase error, by supplying, for example, a m-bit delay control signal to the delay circuit 40 based on the phase error signal. Hence, the delay quantity of the delay circuit 40 is variably controlled so that the rising edge of the delayed clock signal matches the rising edge of the reference clock, that is, so that the delayed clock signal is delayed by a quantity corresponding to k periods of the external clock signal with respect to the reference clock.

The delay control signal output from the delay control circuit 48 is also supplied to a gate circuit 34 via the delay circuit 40. The gate circuit 34 supplies the delay control signal to a latch circuit 36 under the control of the gate control circuit 32. The delay control signal latched by the latch circuit 36 is supplied to the delay circuit 30. The gate control circuit 32, the gate circuit 34 and the latch circuit 36 form a timing adjusting circuit.

The delay circuit 30 has the same construction as the delay circuit 40. A delay quantity of the delay circuit 30 is controlled based on the delay control signal from the latch circuit 36. Hence, the clock signals /CLK and CLK which have mutually inverted phases and are respectively delayed by the delay circuits 30 and 40 are supplied to an output buffer 50.

A DRAM (not shown) which supplies a read data DATA to the output buffer 50 carries out a high-speed access so that an apparent data read speed is doubled by reading the data in synchronism with each of two clock signals having mutually inverted phases. The output buffer 50 carries out a buffering operation with respect to the data on a data bus (not shown), in synchronism with the supplied clock signals /CLK and CLK and outputs a buffered data $D_{OUT}$ via a data output terminal 52.

Figure 4B:
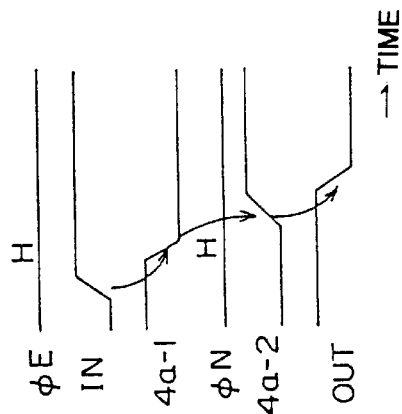
FIGS. 4A, 4B and 4C are diagrams for explaining a delay circuit of the first embodiment.
Figure 4A:
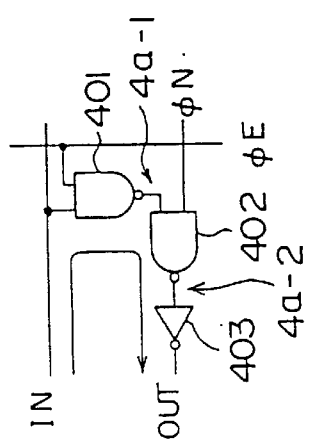
Figure 4C:
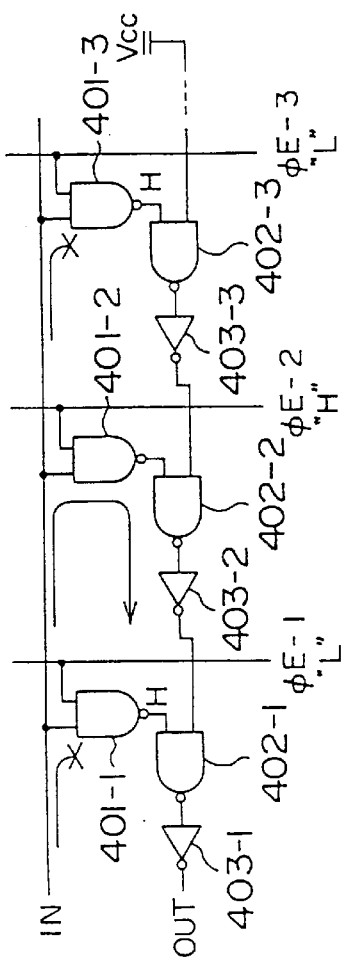

FIGS. 4A, 4B and 4C are diagrams for explaining the delay circuits 30 and 40 which have the same construction. FIG. 4A shows the construction of a unit delay circuit amounting to 1 bit of the delay circuit 30 or 40, and FIG. 4B is a timing chart for explaining the operation of the unit delay circuit shown in FIG. 4A. In addition, FIG. 4C shows the construction of the delay circuit 30 or 40 made up of unit delay circuits which are connected in a plurality of stages.

As shown in FIG. 4A, the unit delay circuit includes two AND gates 401 and 402, and an inverter 403. The unit delay circuit is enabled during a high-level period of an enable signal φE shown in FIG. 4B. FIG. 4B shows a state where the enable signal φE has a high level and the unit delay circuit is accessible. FIG. 4B also shows an input signal IN to the unit delay circuit, an input signal φN which is input to an adjacent unit delay circuit provided on the right side of the unit delay circuits connected in the plurality of stages, an output signal OUT output from the unit delay circuit, and signal waveforms 4a-1 and 4a-2 at corresponding nodes 4a-1 and 4a-2 shown in FIG. 4A. Hence, the output signal OUT of the unit delay circuit corresponds to the input signal φN which is input to an adjacent unit delay circuit provided on the left side of the unit delay circuits connected in the plurality of stages. In FIG. 4B, H denotes a high signal level.

The output signal OUT constantly has a low level when the input signal φN has a low level. In addition, when input signal φN has a high level and the enable signal φE has a low level, the output signal OUT has a high level. When input signal φN has a high level and the enable signal φE has a high level, the output signal OUT has a high level if the input signal IN has a low level, and the output signal OUT has a low level if the input signal IN has a high level.

According to the unit delay circuit shown in FIG. 4A, when the input signal IN rises to a high level in a state where the enable signal φE has a high level, the input signal IN propagates via a path indicated by an arrow. On the other hand, in a state where the enable signal φE has a low level, the input signal IN does not propagate to an output of the unit delay circuit via the path indicated by the arrow.

FIG. 4C shows the unit delay circuits connected in the plurality of stages in a cascade connection, and corresponds to the actual delay circuit 30 or 40. Although FIG. 4C only shows three stages of unit delay circuits, the number of states of the unit delay circuits is set depending on a desired delay quantity to be obtained by the delay circuit 30 or 40. In addition, the signal line for the enable signal φE is actually made up of independent signal lines for enable signals φE-1, φE-2 and φE-3 which are respectively provided with respect to the three unit delay circuits in FIG. 4C, and these enable signals φE-1, φE-2 and φE-3 are controlled by the delay control circuit 48.

In FIG. 4C, the center unit delay circuit of the three unit delay circuits is enabled, and the enable signal φE-2 has a high level. In this case, when the input signal IN makes a transition from a low level to a high level, the input signal IN is blocked by NAND gates 401-1 and 401-3 as indicated by a mark "X", since the enable signals φE-1 and φE-3 of the unit delay circuits on the left and right sides of the center unit delay circuits have a low level.

On the other hand, the enable signal φE-1 of the center unit delay circuit has a high level, and the input signal IN passes through a NAND gate 401-2. Because the output signal OUT of the unit delay circuit on the right side of the center unit delay circuit has a high level, the input signal IN also passes through a NAND gate 402-2, and a low-level signal propagates as the output signal OUT of the center unit delay circuit. Accordingly, when the output signal OUT from the unit delay circuit on the right side of the center unit delay circuit has a low level, that is, the signal φN input to the center unit delay circuit has a low level, the output signal OUT of the center unit delay circuit always has a low level. Hence, this low-level output signal OUT from the center unit delay circuit is successively supplied to the NAND gate 402-1 and the inverter 403-1 of the unit delay circuit on the left side of the center unit delay circuit, and a final output signal OUT of the delay circuit 30 or 40 is obtained from the unit delay circuit on the left side of the center unit delay circuit.

Therefore, the input signal IN propagates through each enabled unit delay circuit before being output as the final output signal OUT of the delay circuit 30 or 40. In other words, the delay quantity of the delay circuit 30 or 40 can be controlled by setting the enable signal φE to a high level only with respect to one or more desired unit delay circuits which are to be enabled. The delay quantity amounting to 1 bit, that is, a unit delay quantity, is determined by a total signal propagation time of the NAND gates 401 and 402 and the inverter 403, and this total propagation time becomes a unit delay time of the DLL circuit. The total delay time of the DLL circuit is obtained by multiplying the number of enabled stages of the unit delay circuits to the unit delay time.

Figure 5:
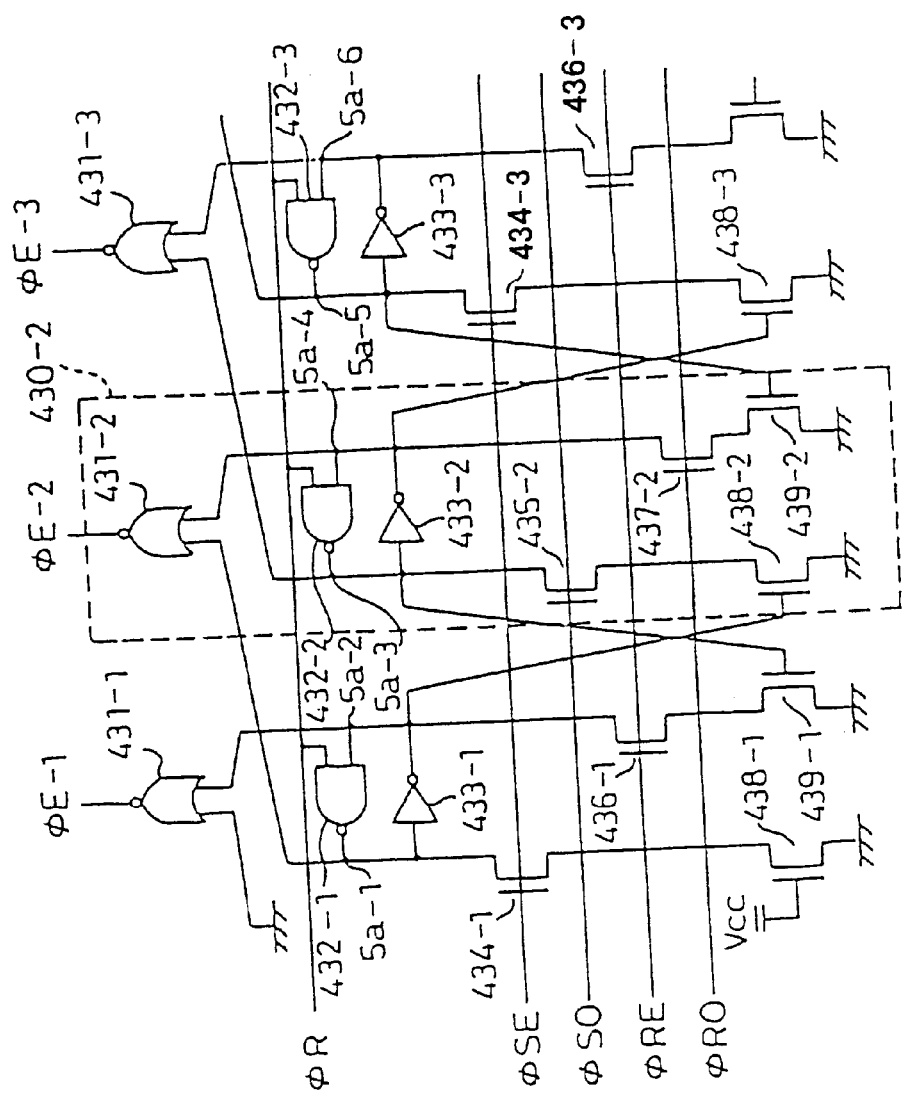
FIG. 5 is a circuit diagram showing an embodiment of a delay control circuit of the first embodiment.

FIG. 5 is a circuit diagram showing an embodiment of the delay control circuit 48 shown in FIG. 3. The delay control circuit 48 shown in FIG. 5 includes a number of unit delay control circuits 430-2 corresponding to the number of stages of the unit delay circuits of the delay circuits 30 and 40. Each unit delay control circuit 430-2 includes the unit delay circuit described above in conjunction with FIGS. 4A through 4C. An output signal of each unit delay control circuit 430-2 becomes the enable signal φE of the unit delay circuit of the corresponding stage.

The unit delay control circuit 430-2 includes a NAND gate 432-2 and an inverter 433-2 which form a flip-flop, transistors 435-2 and 438-2 which are connected in series on one end of the flip-flop, transistors 437-2 and 439-2 which are connected in series on the other end of the flip-flop, and a NOR gate 431-2. A gate of the transistor 438-2 is connected to a node 5a-2 of the unit delay control circuit of the preceding stage, and a gate of the transistor 439-2 is connected to a node 5a-5 of the unit delay control circuit of the subsequent stage, so that the unit delay control circuit 430-2 receives signals from the unit delay control circuits of both the preceding and subsequent stages. On the other hand, set signals φSE and φSO which are used at the time of a count-up operation and reset signals φRE and φRO which are used at the time of a count-down operation are supplied to selected transistors which are connected on both ends of the flip-flop of each of the unit delay control circuits.

More particularly, the set signal φSE is supplied to transistors 434-1, 434-4, . . . of every other unit delay control circuit (corresponding to every other bit) in an even numbered stage excluding the unit delay control circuit 430-2, and the reset signal φRE is supplied to transistors 436-1, 436-3, . . . of every other unit delay control circuit in the even numbered stage excluding the unit delay control circuit 430-2, as shown in FIG. 5. Furthermore, the set signal φSO is supplied to transistors 435-2, . . . of every other unit delay control circuit (corresponding to every other bit) in an odd numbered stage including the unit delay control circuit 430-2, and the reset signal φRO is supplied to transistors 437-2, . . . of every other unit delay control circuit in the odd numbered stage including the unit delay control circuit 430-2. In addition, a signal from a node 5a-1 of the unit delay control circuit in the preceding stage (on the left side in FIG. 5) and a signal from the node 5a-4 of the unit delay control circuit 430-2 are input to the OR gate 431-2 of the unit delay control circuit 430-2. A reset signal φR is supplied to each unit delay control circuit, including the unit delay control circuit 430-2, for resetting each unit delay control circuit. This reset signal φR temporarily assumes a low level after the power of the semiconductor integrated circuit device is turned ON, and is thereafter fixed to a high level.

Figure 6:
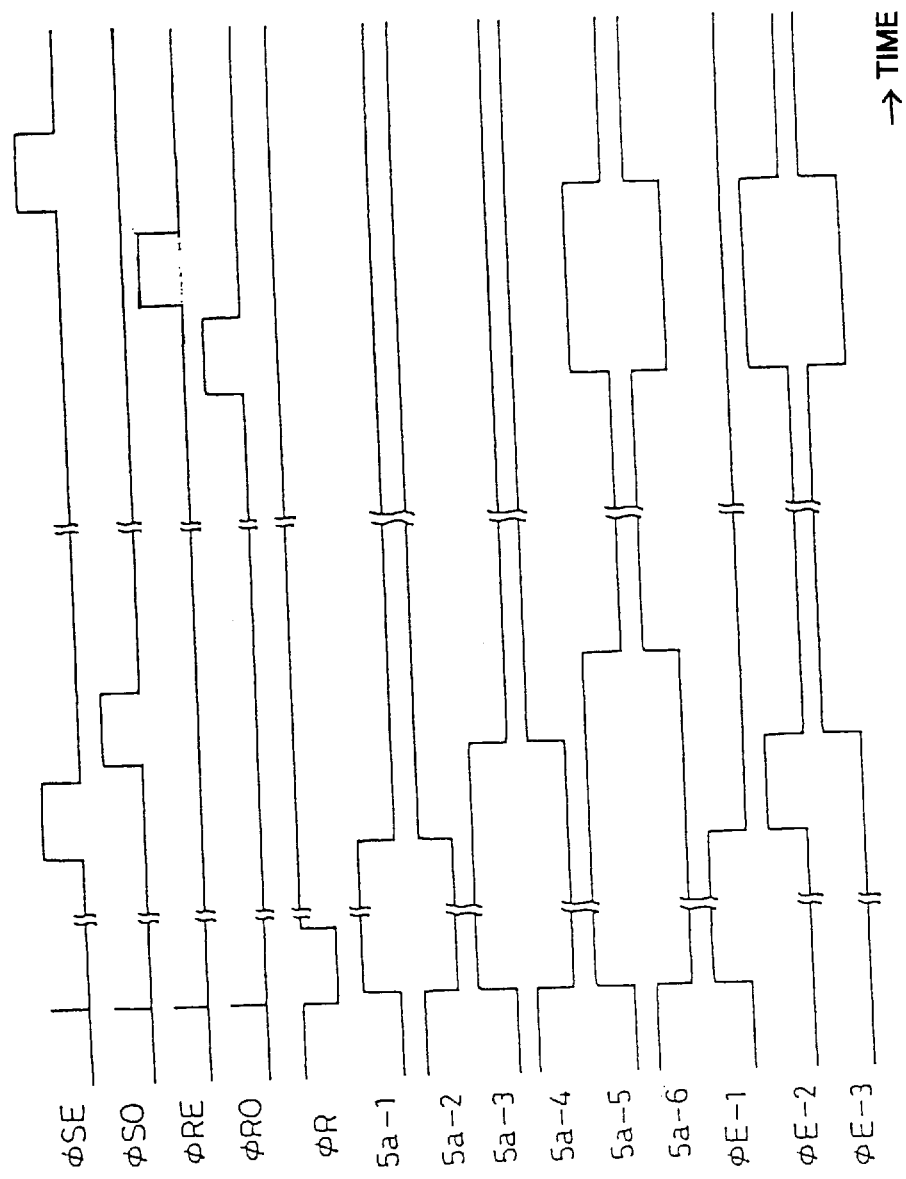
FIG. 6 is a timing chart for explaining the operation of the delay control circuit shown in FIG. 5.

FIG. 6 is a timing chart for explaining the operation of the delay control circuit 48 shown in FIG. 5.

As shown in FIG. 6, the reset signal φR temporarily assumes a low level, and the nodes 5a-1, 5a-3 and 5a-5 are set to a high signal level while the nodes 5a-2, 5a-4 and 5a-6 are set to a low signal level. When carrying out the count-up operation, the set signals φSE and φSO which are used as count-up signals alternately assume high and low levels repeatedly.

When the set signal φSE makes a transition from a low level to a high level, the node 5a-1 is grounded and assumes a low signal level, and the node 5a-2 makes a transition to a high signal level. In response to the transition of the node 5a-2 to the high signal level, the enable signal (output signal) φE-1 makes a transition from a high level to a low level. This state is latched by the flip-flop, and the enable signal φE-1 remains at the low level even if the set signal φSE returns to the low level. Responsive to the transition of the node 5a-1 to the low signal level, the enable signal (output signal) φE-1 makes a transition from a low level to a high level. Since the node 5a-2 makes the transition to the high signal level, the transistor 438-2 turns ON, and the set signal φS makes a transition from a low signal level to a high signal level. As a result, the node 5a-3 is grounded and assumes a low signal level, and the node 5a-4 makes a transition to a high signal level. Furthermore, responsive to the transition of the node 5a-4 to the high signal level, the enable signal φE-2 makes a transition from a high level to a low level. This state is latched by the flip-flop of the unit delay control circuit 430-2, and the enable signal φE-2 remains at the low level even if the set signal φSO returns to the low level.

Responsive to the transition of the node 5a-3 to the low signal level, the enable signal φE-3 makes a transition from a low level to a high level. In FIG. 6, only one pulse is shown for the set signals φSE and φSO, but when the unit delay control circuits are connected in the plurality of stages and the set signals φSE and φSO alternately repeat the high and low levels, the position of the stage from which the high-level enable signal (output signal) φE is obtained successively shifts towards the right side in FIG. 5. Hence, when it is necessary to increase the delay quantity of the delay circuit 30 or 40 based on the phase error signal from the phase comparator 44, the pulses of the set signals φSE and φSO are alternately input to the delay control circuit 48.

When a state where the set signals φSE and φSO which are used as the count-up signals and the reset signals φRE and φRO which are used as the count-down signals are not output, that is, the signals φSE, φSO, φRE and φRO are maintained at the low level, the position of the stage where the enable signal φE assumes the high level is fixed. Accordingly, when it is necessary to maintain the delay quantity of the delay circuit 30 or 40 based on the phase error signal from the phase comparator 44, no pulse of the signals φSE, φSO, φRE and φRO is input to the delay control circuit 48.

When carrying out the count-down operation, the reset signals φRE and φRO are alternately input to the delay control circuit 48, and the position of the stage from which the high-level enable signal (output signal) φE is obtained successively shifts towards the left side in FIG. 5, that is, in a direction opposite to that during the count-up operation.

Therefore, in the delay control circuit 48 shown in FIG. 5, it is possible to successively shift the position of the stage from which the high-level enable signal φE is obtained by one stage (corresponding to one bit) by inputting the pulses of the signals φSE, φSO, φRE and φRO to the delay control circuit 48. By controlling the unit delay circuits shown in FIG. 4C by the enable signal φE, it is possible to control the delay quantity of the delay circuit 30 or 40 in units of the unit delay time.

Next, a description will be given of the construction of the phase comparator 44 shown in FIG. 3. The phase comparator 44 includes a phase comparing section shown in FIG. 7, and an amplifier circuit section shown in FIG. 9. A description will first be given of the phase comparing section shown in FIG. 7, by referring to FIGS. 8A, 8B and 8C. FIG. 8A is a timing chart for explaining the operation of the phase comparing section during a count-up operation, FIG. 8B is a timing chart for explaining the operation of the phase comparing section during the count-hold operation, and FIG. 8C is a timing chart for explaining the operation of the phase comparing section during the count-down operation. In FIGS. 8A through 8C and subsequent figures, L denotes a low signal level, and H denotes a high signal level.

In FIGS. 8A through 8C, signals φout and φext respectively indicate an output signal (SO) and an external clock signal (S3) which are to be compared by the phase comparing section, and the phase of the signal φout is judged with reference to the signal φext. In addition, signals φa through φe indicate output signals of the phase comparing section supplied to the amplifier circuit section shown in FIG. 9.

Figure 7:
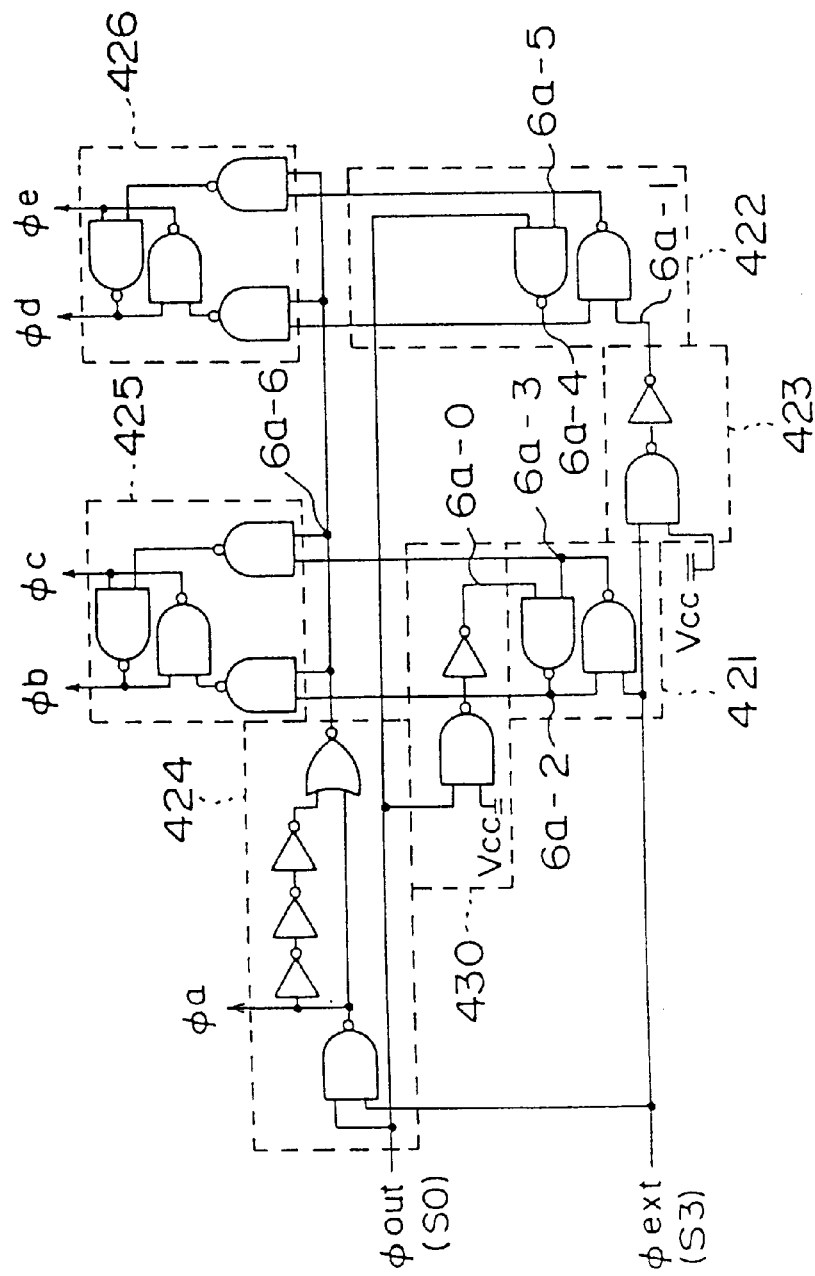
FIG. 7 is a circuit diagram showing an embodiment of a phase comparing section of a phase comparator of the first embodiment.

As shown in FIG. 7, the phase comparing section of the phase comparator 44 includes flip-flop circuits 421 and 422 which are respectively made up of two NAND gates, latch circuits 425 and 426 which states of the corresponding flip-flop circuits 421 and 422, a circuit 424 which generates enable signals for the latch circuits 425 and 426, a delay circuit 423 which delays the external clock signal φext by a unit delay quantity, and a delay circuit 430 which delays the signal φout by the unit delay quantity. The flip-flop circuit 421 makes a phase comparison in a range −td, and the flip-flop circuit 422 makes a phase comparison in a range +td.

FIG. 8A shows a case where the phase of the signal φout to be compared is advanced by an amount exceeding td with respect to the external clock signal (reference signal) φext, that is, a case where the signal φout makes a transition from a low level to a high level before the external clock signal φext. When both the signals φout and φext have the low level, all nodes 6a-2, 6a-3, 6a-4 and 6a-5 of the flip-flop circuits 421 and 422 have a high signal level.

When the signal φout makes the transition from the low level to the high level, the node 6a-4 changes from the high signal level to the low signal level, and a node 6a-0 changes from the low level to the high level after 1 delay time td, and the node 6a-2 as a result changes from the high signal level to the low signal level. Thereafter, the external clock signal φext makes the transition from the low level to the high level, and the node 6a-1 changes from the low signal level to the high signal level after 1 delay time td, but the potentials on both ends of the flip-flop circuits 421 and 422 are already definite and do not change. As a result, the nodes 6a-2, 6a-3, 6a-4 and 6a-5 respectively maintain the low signal level, the high signal level, the low signal level and the high signal level.

On the other hand, responsive to the transition of the external clock signal φtext from the low level to the high level, the output signal φa of the circuit 424 makes a transition from the low level to the high level, and a high-level pulse is temporarily applied to a node 6a-6. This node 6a-6 connects to inputs of NAND gates of each of the latch circuits 425 and 426. Hence, the NAND gates of each of the latch circuits 425 and 426 are temporarily enabled, and the potential states on both ends of the flip-flop circuits 421 and 422 are read into the latch circuits 425 and 426. Finally, the output signals φb, φc, φd and φe respectively assume the high level, the low level, the high level and the low level.

FIG. 8B shows a case where the phases of both the signals φout and φext are approximately the same and the phase error falls within a range ±d, and the signals φout and φext make a transition from the low level to the high level approximately at the same time. When the signal φout makes a transition from the low level to the high level within a time difference between a time when the signal φout rises and a time when the signal level at the node 6a-1 rises, the external clock signal φ ext first makes a transition from the low level to the high level, so that the node 6a-3 of the flip-flop circuit 421 changes from the low signal level to the high signal level. On the other hand, in the flip-flop circuit 422, the node 6a-1 remains at the low signal level, and thus, the node 6a-4 changes from the high signal level to the low signal level. Thereafter, the node 6a-1 changes from the high signal level to the low signal level, but since the state of the flip-flop circuit 422 is already determined, no change occurs. Further, because the node 6a-6 temporarily assumes the high signal level, the latch circuit 426 stores this state. Consequently, the output signals φb, φc, φd and φe respectively assume the low level, the high level, the high level and the low level.

FIG. 8C shows a case where the phase of the signal φout lags by an amount exceeding td with respect to the external clock signal φext, and the signal φout makes a transition from the low level to the high level after the external clock signal φext. In this case, a change occurs in the two flip-flop circuits 421 and 422 in response to the external clock signal φext, and the nodes 6a-3 and 6a-5 change from the high signal level to the low signal level. Finally, the output signals φb, φc, φd and φe respectively assume the low level, the high level, the low level and the high level.

Accordingly, it is possible to detect, with reference to the time when the external clock signal φext rises, whether the signal φout rises to the high level before, approximately at the same time as, or after the external clock signal φext. Such detection results are latched as values of the output signals φb, φc, φd and φe, and it is possible to determine whether the delay control circuit 48 is to carry out the count-up operation or the count-down operation.

Next, a description will be given of the amplifier circuit section of the phase comparator 44 shown in FIG. 9, by referring to FIGS. 9 and 10. FIG. 10 is a timing chart for explaining the operation of a JK flip-flop of the amplifier circuit section shown in FIG. 9.

Figure 9:
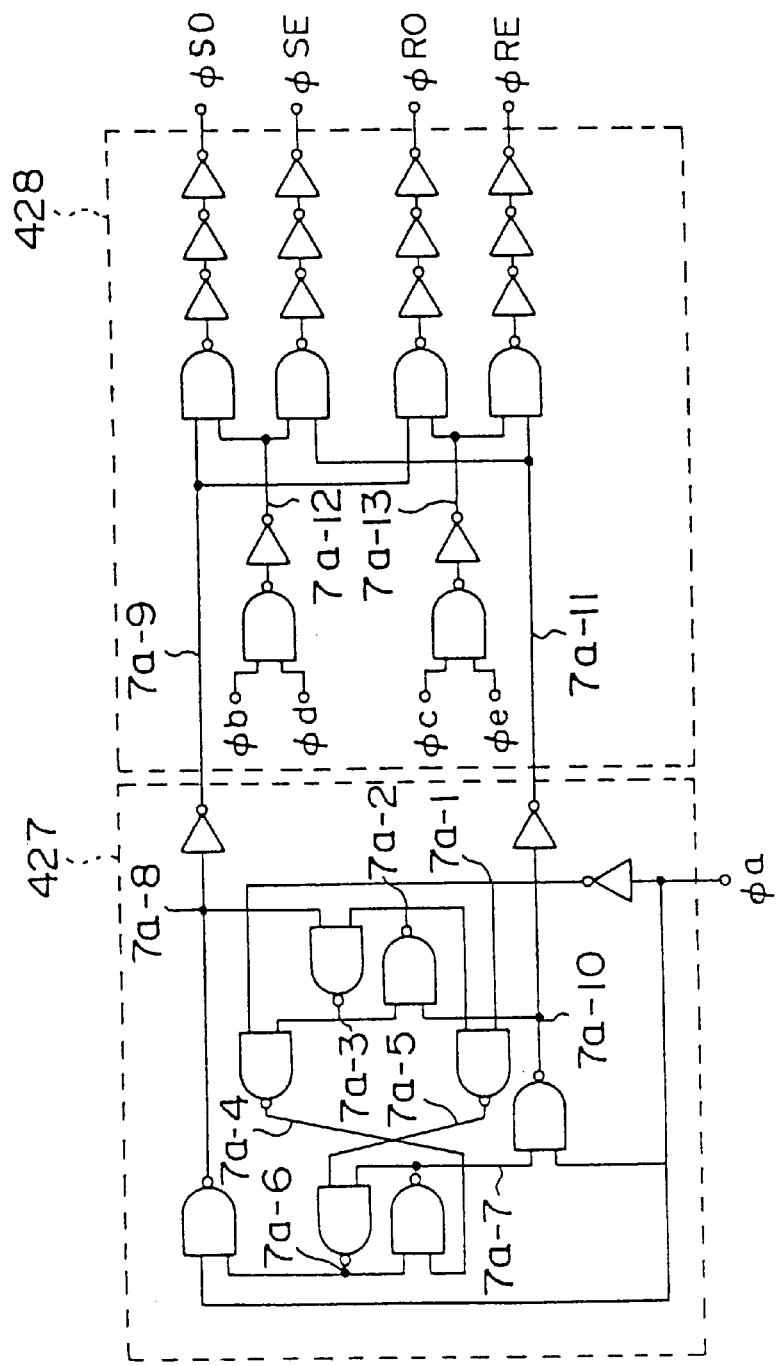
FIG. 9 is a circuit diagram showing an embodiment of an amplifier circuit section of the phase comparator of the first embodiment.
Figure 10:
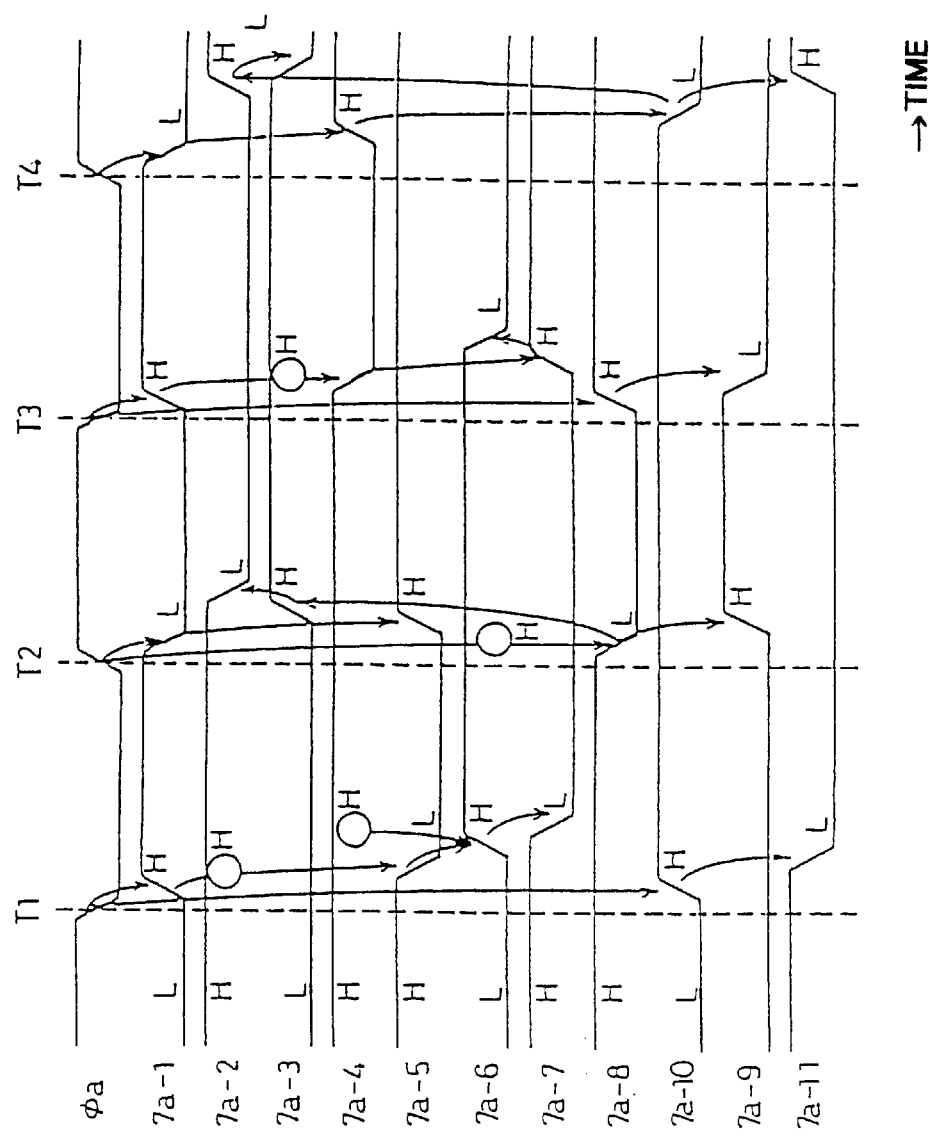
FIG. 10 is a timing chart for explaining the operation of a JK flip-flop of the amplifier circuit section shown in FIG. 9.

As shown in FIG. 9, the amplifier circuit section of the phase comparator 44 is made up of two parts, namely, a JK flip-flop 427 and an amplifier 428 which includes NAND gates and inverters. The output signal φa of the phase comparing section shown in FIG. 7 is input to the JK flip-flop 427, and potentials at nodes 7a-9 and 7a-11 alternately repeat the low signal level and the high signal level depending on whether the output signal φa as a low level or a high level. The amplifier 428 receives and amplifies an output signal of the JK flip-flop 427 and the output signals φb and φd of the phase comparing section shown in FIG. 7.

First, a description will be given of the operation of the JK flip-flop 427 with reference to FIG. 10. When the signal φa makes a transition from the high level to the low level at a time T1, nodes 7a-1 and 7a-10 change from the low signal level to the high signal level. On the other hand, signal levels at nodes 7a-5, 7a-6 and 7a-7 change responsive to the change of the signal level at the node 7a-1, but the signal level at a node 7a-8 does not change because the signal φa has the low level. As a result, an output signal of the JK flip-flop 427 from the node 7a-9 does not change, and only an output signal of the JK flip-flop 427 from the node 7a-11 makes a transition from the low level to the high level. Next, when the signal φa makes a transition from the low level to the high level at a time T2, the node 7a-8 changes from the high signal level to the low signal level, and the signal level at the node 7a-10 does not change since the signal level at the node 7a-7 does not change, contrary to the operation at the time T1. As a result, the output signal of the JK flip-flop 427 from the node 7a-9 makes a transition from the low level to the high level, and the output signal of the JK flip-flop 427 from the node 7a-11 does not change. Therefore, high-level and low-level output signals are alternately obtained from the nodes 7a-9 and 7a-11 of the JK flip-flop 427 depending on the signal φa.

Figure 11:
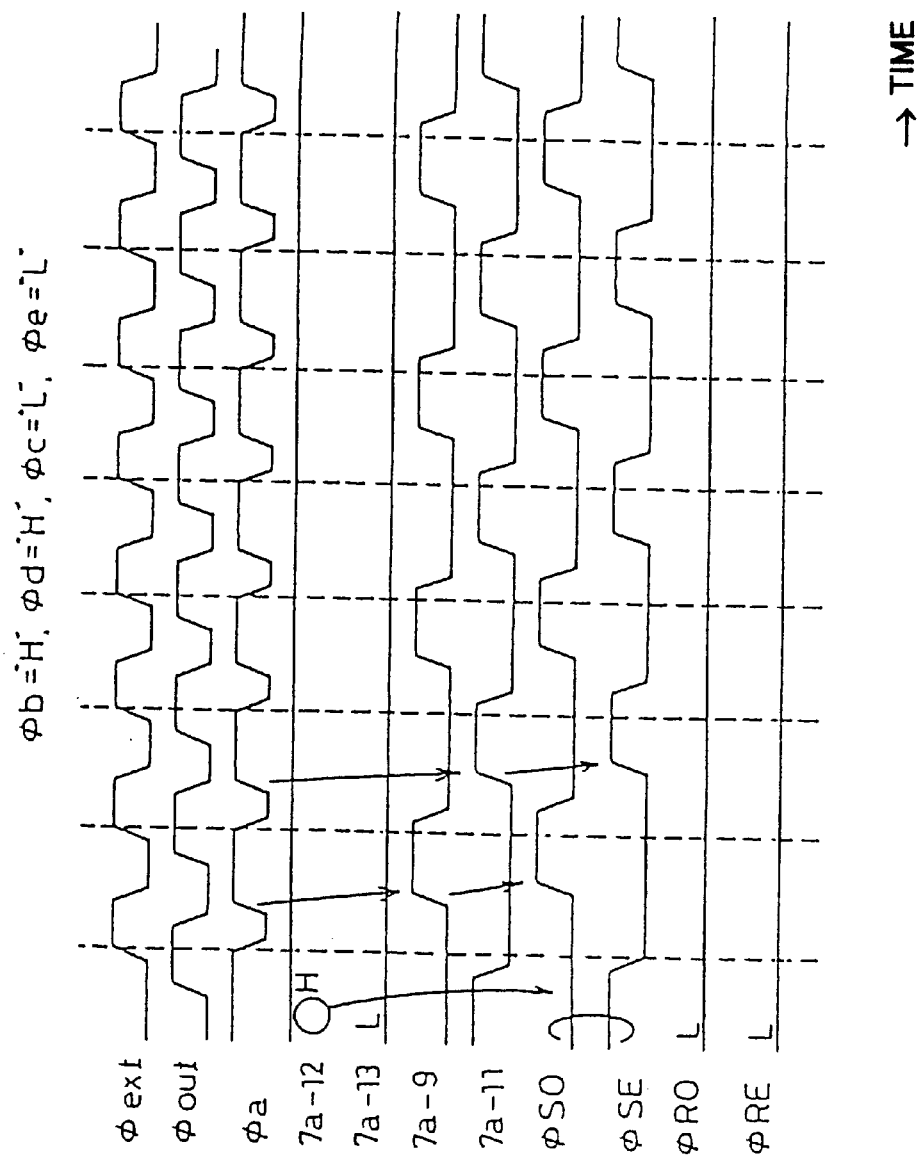
FIG. 11 is a timing chart for explaining the operation of the amplifier circuit section shown in FIG. 9 during a count-up operation.
Figure 12:
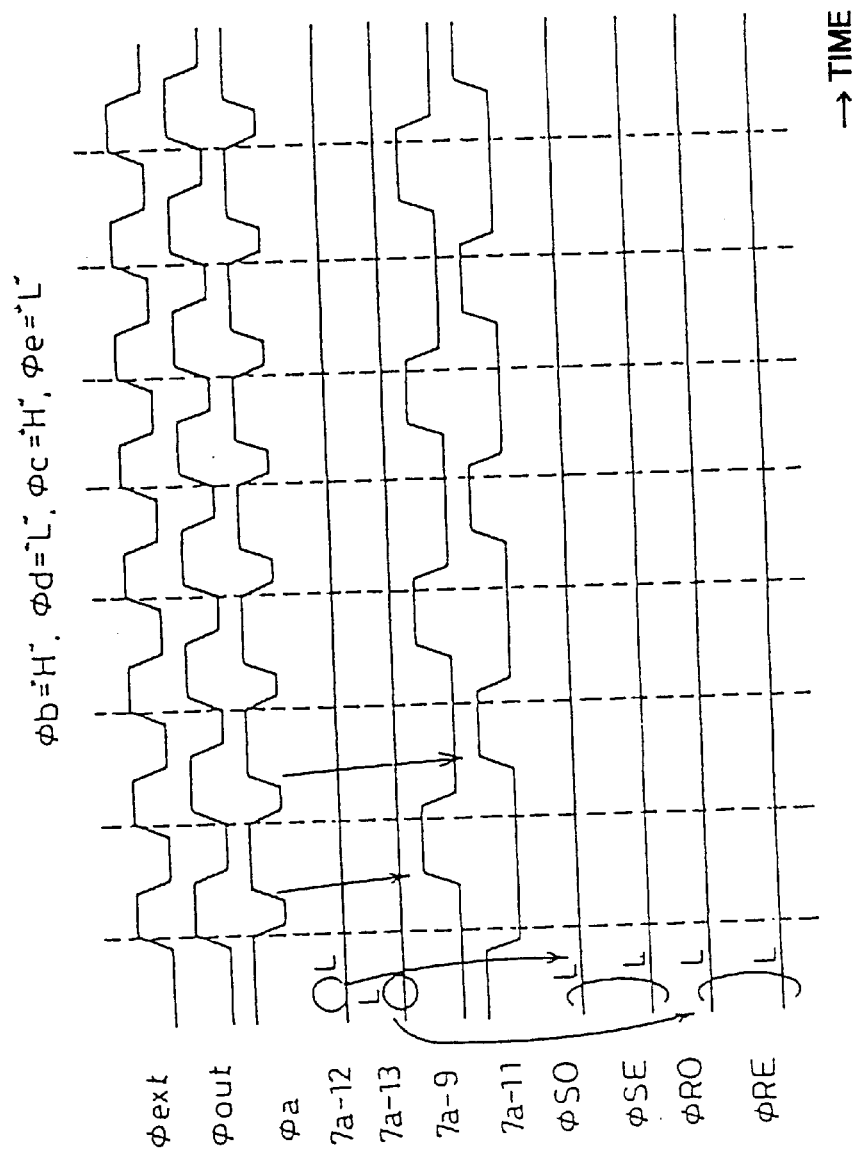
FIG. 12 is a timing chart for explaining the operation of the amplifier circuit section shown in FIG. 9 during a count-hold operation.
Figure 13:
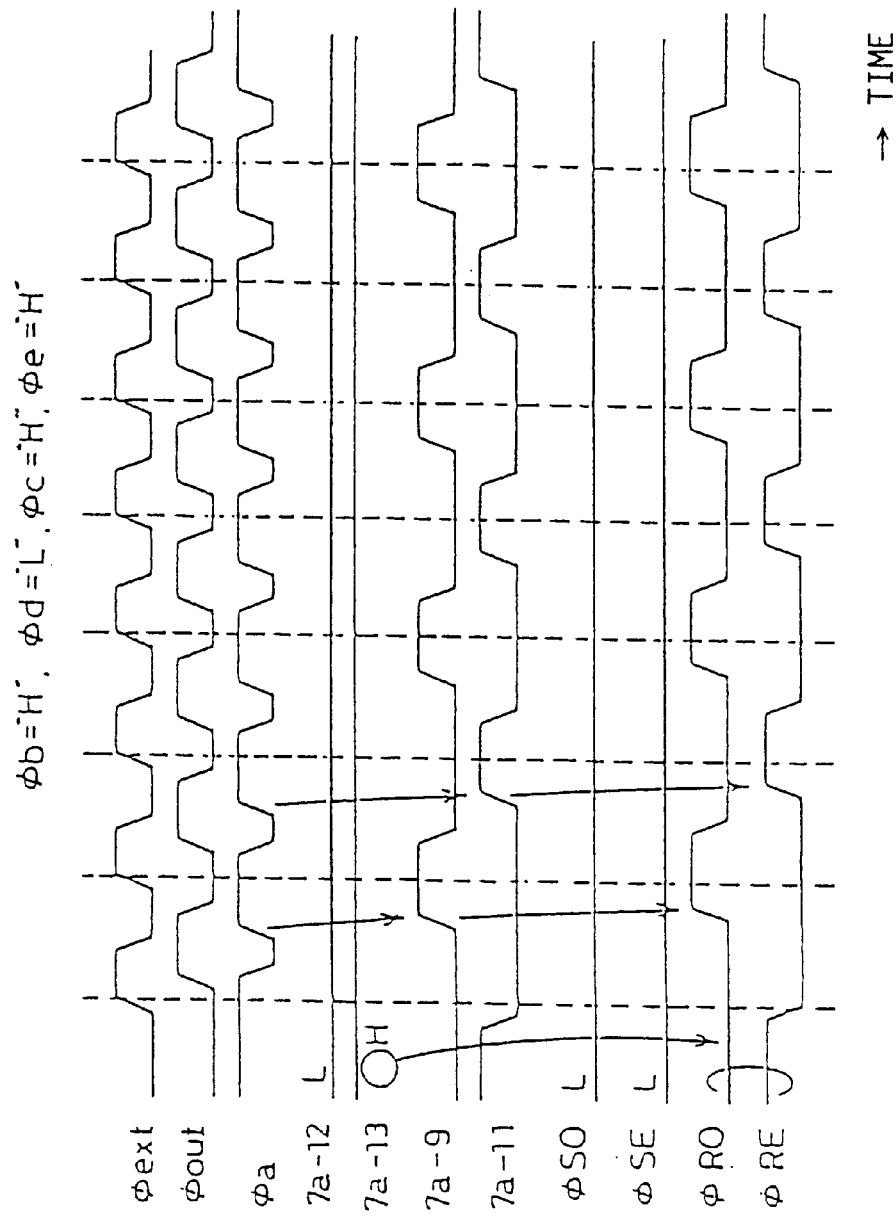
FIG. 13 is a timing chart for explaining the operation of the amplifier circuit section shown in FIG. 9 during a count-down operation.

FIG. 11 is a timing chart for explaining the operation of the amplifier circuit section during the count-up operation. FIG. 12 is a timing chart for explaining the operation of the amplifier circuit section during the count-hold operation. In addition, FIG. 13 is a timing chart for explaining the operation of the amplifier circuit section during the count-down operation. The operation of the amplifier 428 shown in FIG. 9 will now be described with reference to FIGS. 11 through 13.

FIG. 11 shows a case where the signal φout makes a transition from the low level to the high level before the external clock signal φext rises to the high level. In this case, the signals φb, φc, φd and φe output from the phase comparing section and input to the amplifier 428 respectively have the high level, the low level, the high level and the low level. As a result, a node 7a-12 assumes the high signal level, and a node 7a-13 is fixed to the low signal level. The set signals φSO and φSE change depending on the state of the JK flip-flop 427, but the reset signals φRO and φRE do not change because the node 7a-13 is fixed to the low signal level.

FIG. 12 shows a case where the signal φout makes a transition from the low level to the high level, approximately at the same time as the external clock signal next. In this case, the signals φb, φc, φd and φe output from the phase comparing section and input to the amplifier 428 respectively have the low level, the high level, the high level and the low level. As a result, the nodes 7a–12 and 7a–13 are fixed to the low signal level. The set signals φSO and φSE do not change depending on the state of the JK flip-flop 427, and the set signals φSO and φSE and the reset signals φRO and φRE are fixed to the low signal level.

FIG. 13 shows a case where the signal φout makes a transition from the low level to the high level after the external clock signal φext rises to the high level. In this case, the signals φb, φc, φd and φe output from the phase comparing section and input to the amplifier 428 respectively have the low level, the high level, the low level and the high level. As a result, the node 7a–12 is fixed to the low signal level, and the node 7a–13 is fixed to the high signal level. The reset signals φRO and φRE change depending on the state of the JK flip-flop 427, but the set signals φSO and φSE do not change because the node 7a–12 is fixed to the low signal level.

Figure 14:
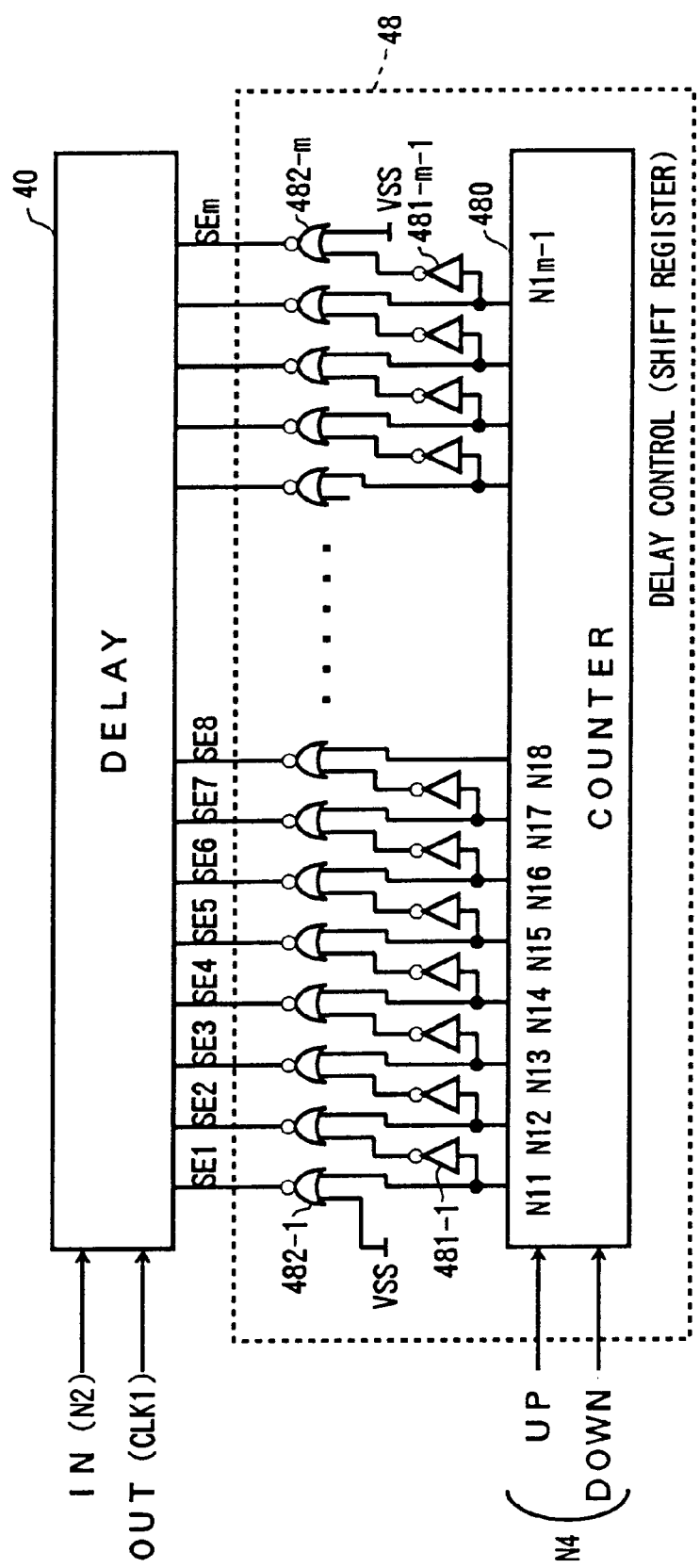
FIG. 14 is a system block diagram showing another embodiment of the delay control circuit of the first embodiment.
Figures 15A, 15B:
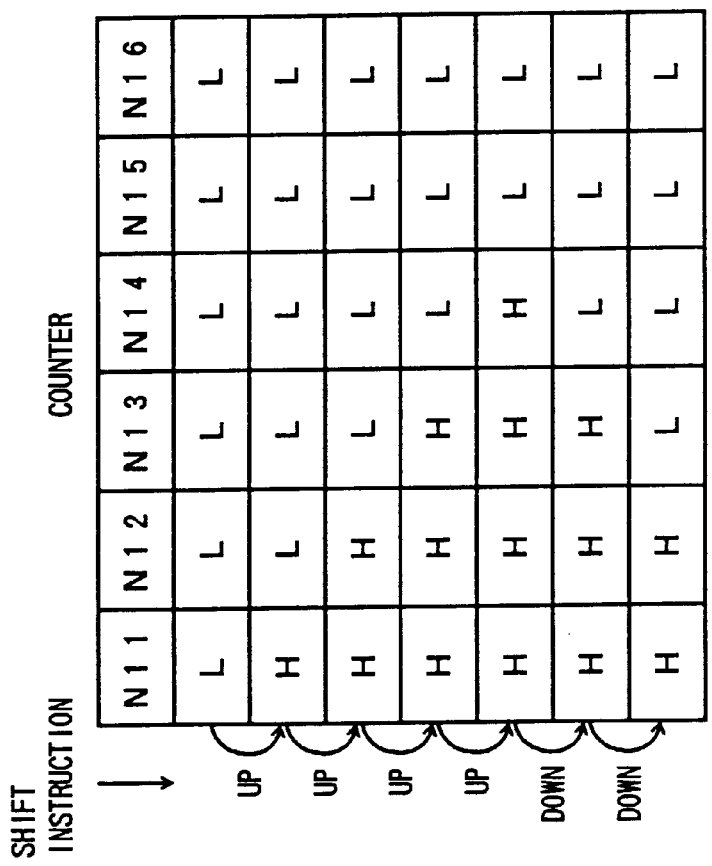
FIGS. 15A and 15B are diagrams for explaining the operation of the delay control circuit shown in FIG. 14.

FIG. 14 is a system block diagram showing an embodiment of the delay control circuit 48. The delay control circuit 48 shown in FIG. 14 is basically a shift register which uses a counter 480. The counter 480 receives from the phase comparator 44 a signal UP which corresponds to the set signals φSO and φSE and a signal DOWN which corresponds to the reset signals φRO and φRE. This counter 480 forms an up-down counter which shifts outputs from terminals N11 through N1m-1 in response to the signals UP and DOWN, as shown in FIG. 15A. In other words, a terminal which outputs a high-level signal is shifted to the left, in a direction towards the terminal N1m-1, in response to the signal UP. On the other hand, a terminal which outputs a high-level signal is shifted to the right, in a direction towards the terminal N11, in response to the signal DOWN.

FIGS. 15A and 15B respectively show the signal levels only for the terminals N11 through N16 of the terminals N11 through N1m-1, and only for terminals SE1 through SE6 of terminals SE1 through SEm of the delay control circuit 48.

The outputs from the terminals N11 through N1m-1 of the counter 480 shown in FIG. 15A are converted into signal levels shown in FIG. 15B by inverters 481-1 through 481-m and NOR gates 482-1 through 482-m, so that a high-level signal is output from only a leftmost selected one of the terminals SE1 through SEm. The outputs from the terminals SE1 through SEm of the delay control circuit 48 are supplied to the delay circuits 30 and 40 shown in FIG. 3.

Figure 16:
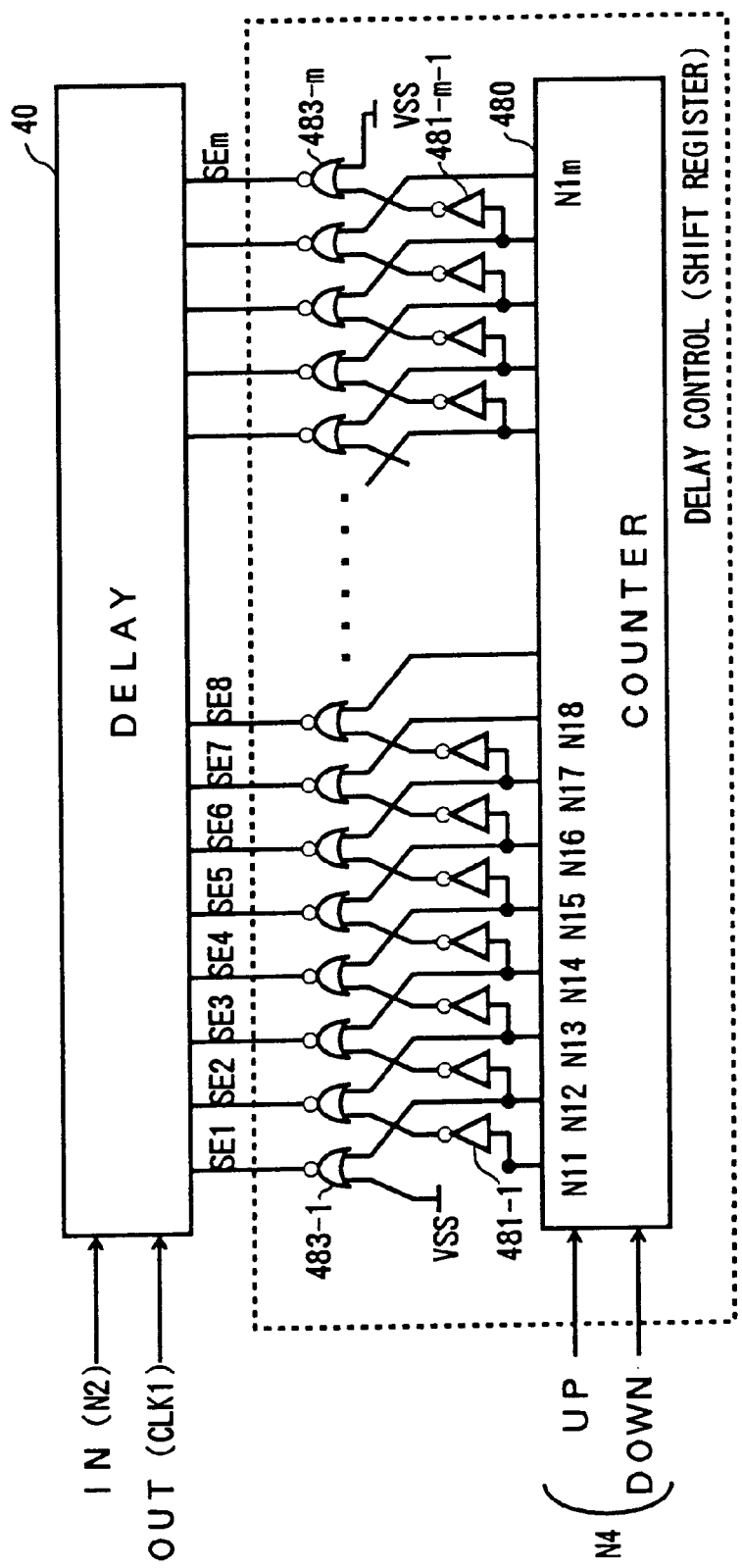
FIG. 16 is a system block diagram showing another embodiment of the delay control circuit of the first embodiment.

FIG. 16 is a system block diagram showing another embodiment of the delay control circuit 48. In FIG. 16, those parts which are the same as those corresponding parts in FIG. 14 are designated by the same reference numerals, and a description thereof will be omitted.

The delay control circuit 48 shown in FIG. 16 is basically a shift register which uses the counter 480. The counter 480 receives from the phase comparator 44 the signal UP which corresponds to the set signals φSO and φSE and the signal DOWN which corresponds to the reset signals φRO and φRE. This counter 480 forms an up-down counter which shifts outputs from the terminals N11 through N1m-1 in response to the signals UP and DOWN, as shown in FIG. 17A. In other words, the terminal which outputs the high-level signal is shifted to the left, in the direction towards the terminal N1m-1, in response to the signal UP. On the other hand, the terminal which outputs the high-level signal is shifted to the right, in the direction towards the terminal N11, in response to the signal DOWN.

FIGS. 17A and 17B respectively show the signal levels only for the terminals N11 through N16 of the terminals N11 through N1m-1, and only for terminals SE1 through SE6 of terminals SE1 through SEm of the delay control circuit 48.

The outputs from the terminals N11 through N1m-1 of the counter 480 shown in FIG. 17A are converted into signal levels shown in FIG. 17B by inverters 481-1 through 481-m-1 and NOR gates 483-1 through 483-m, so that a high-level signal is output from only leftmost two selected adjacent terminals of the terminals SE1 through SEm, excluding the case where all of the terminals N11 through N16 output a low-level signal. The outputs from the terminals SE1 through SEm of the delay control circuit 48 are supplied to the delay circuits 30 and 40 shown in FIG. 3.

In this embodiment of the delay control circuit 48, at least one of the terminals SE1 through SEm outputs a high-level signal even during a register transition of the counter 480, and one of the delay stages of the delay circuits 30 and 40 is always selected. For this reason, it is possible to stabilize the operation of the delay circuits 30 and 40.

Figure 18:
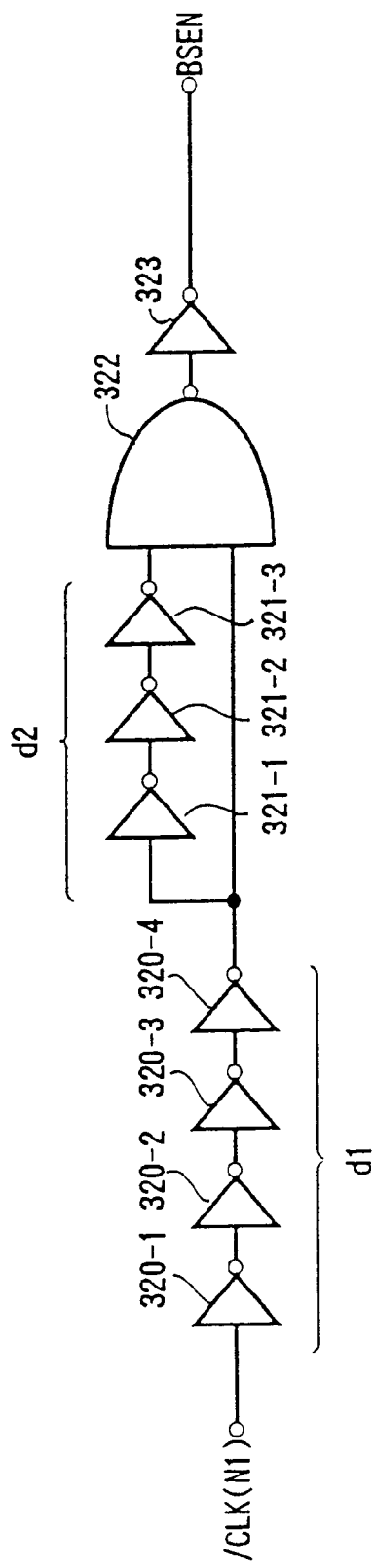
FIG. 18 is a circuit diagram showing an embodiment of a gate control circuit of the first embodiment.
Figure 19:
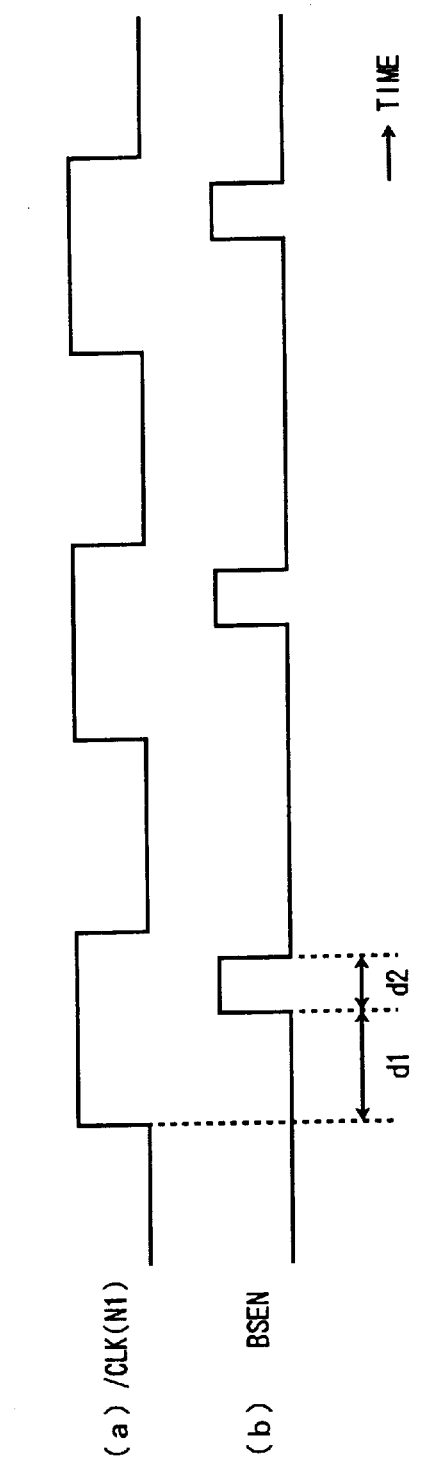
FIGS. 19(a) and 19(b) are timing charts for explaining the operation of the gate control circuit shown in FIG. 18.

FIG. 18 is a circuit diagram showing an embodiment of the gate control circuit 32 shown in FIG. 3. The external clock signal /CLK shown in FIG. 19(a) which is obtained via the input buffer 20 shown in FIG. 3 is delayed by a delay time d1 by inverters 320-1 through 320-4 shown in FIG. 18. The delayed external clock signal /CLK is directly supplied to a NAND gate 322 on one hand, and is supplied via inverters 321-1 through 321-3 which further delay the delayed external clock signal /CLK by a delay time d2 on the other. Hence, a signal BSEN shown in FIG. 19(b) is output from an inverter 323 which receives an output of the NAND gate 322. This signal BSEN is a pulse signal which rises after the delay time d1 from the rise of the external clock signal /CLK and has a pulse width corresponding to the delay time d2.

FIG. 20A is a system block diagram showing an embodiment of the gate circuit 34 and the latch circuit 36 shown in FIG. 3. In FIG. 20A, the gate circuit 34 includes gate units 340-1 through 340-m. The signals from the terminals SE1 through SEm of the delay control circuit 48 are respectively supplied to the gate units 340-1 through 340-m, and the signal BSEN from the gate control circuit 32 is supplied in common to each of the gate units 340-1 through 340-m. Each of the gate units 340-1 through 340-m has a construction shown in FIG. 20B, and functions as a transmission gate which passes an input signal only when turned ON by a high-level signal BSEN. When the gate units 340-1 through 340-m are turned ON, the signals from the terminals SE1 through SEm of the delay control circuit 48 are supplied to the latch circuit 36 as signals SD1 through SDm.

The latch circuit 36 includes latch units 360-1 through 360-m. The signals SD1 through SDm are respectively supplied to the gate units 340-1 through 340-m, latched by the gate units 340-1 through 340-m, and supplied to the delay circuit 30. Each of the latch units 360-1 through 360-m has a construction shown in FIG. 20C, and includes a latch loop made up of inverters 361 and 362, and a resetting MOS transistor 363. The MOS transistor 363 is turned ON when a high-level signal STTZ is supplied to a gate of the MOS transistor 363, and resets the output signal of the corresponding latch unit to a low level. This signal STTZ has the high level only when the power is turned ON.

In other words, during the high-level period (pulse width d2) of the signal BSEN which rises after the delay time d1 from the rise of the external clock signal /CLK, the signals from the terminals SE1 through SEm of the delay control circuit 48 are supplied to the latch circuit 36 as the signals SD1 through SDm. For this reason, the timing at which the signals SD1 through SDm change is delayed up to the timing when the signal BSEN rises, and no noise is generated at the rising edge of the external clock signal /CLK.

Figure 21:
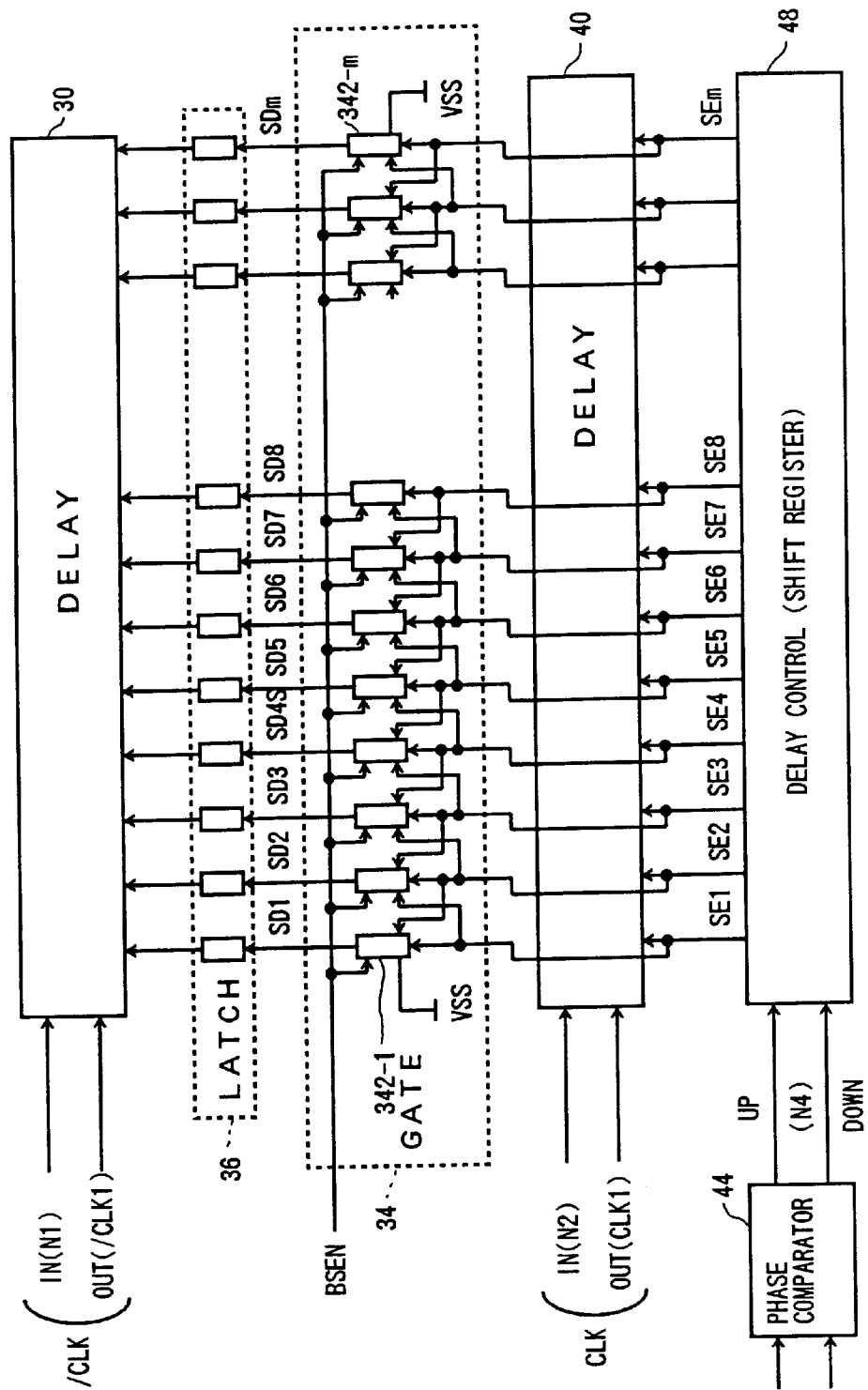
FIG. 21 is a system block diagram showing another embodiment of the gate circuit.

FIG. 21 is a system block diagram showing another embodiment of the gate circuit 34 shown in FIG. 3. In FIG. 21, those parts which are the same as those corresponding parts in FIG. 20A are designated by the same reference numerals, and a description thereof will be omitted.

In FIG. 21, the gate circuit 34 includes gate units 342-1 through 342-m. Each gate unit 342-i is supplied with the signal from a corresponding terminal SEi of the delay control circuit 48, and the signals from terminals SEi−1 and SEi+1 which are adjacent to the terminal SEi, where i is an integer satisfying i=1, . . . , m. However, since only one adjacent terminal SE2 exists with respect to the terminal SE1 of the delay control circuit 48, the gate unit 342-1 is supplied with the signals from the terminals SE1 and SE2 and a low-level signal having a potential VSS. Similarly, because only one adjacent terminal SEm-1 exists with respect to the terminal SEm of the delay control circuit 48, the gate unit 342-m is supplied with the signals from the terminals SEm-1 and SEm and a low level signal having the potential VSS.

Figures 22A, 22B:
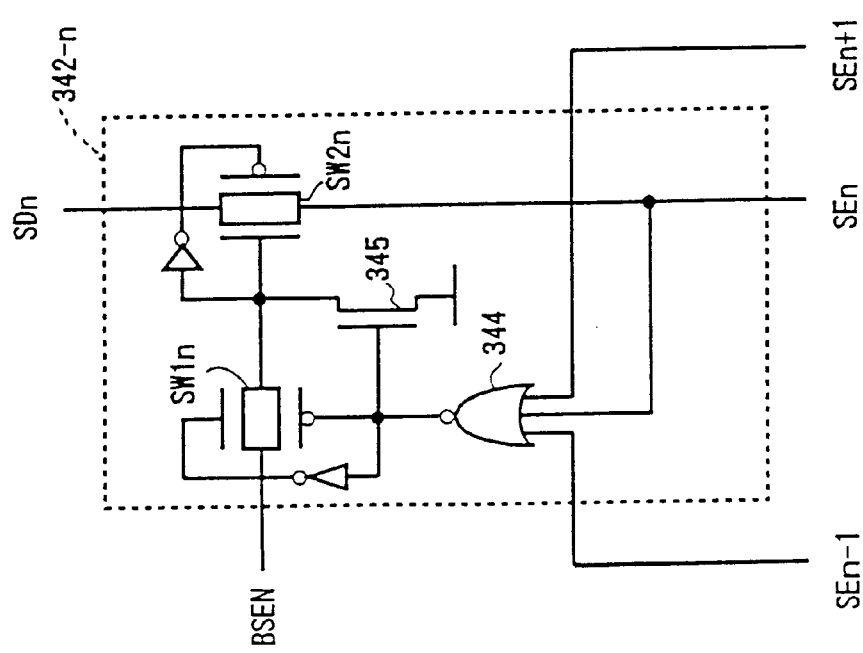
FIGS. 22A and 22B are diagrams for explaining an embodiment of a gate unit.

FIG. 22A is a circuit diagram showing an embodiment of the gate unit 342-n which may be used in the gate circuit 34 shown in FIG. 21, where n is an integer satisfying n=1, . . . , m. The signal from the terminal SEn corresponding to the gate unit 342-n is supplied to a transmission gate SW2n and a NOR gate 344, and the signals from the terminals SEn−1 and SEn+1 adjacent to the terminal SEn are also supplied to the NOR gate 344. An output signal of the NOR gate 344 is supplied to a transmission gate SW1n as a control input. The transmission gate SW1n is turned ON when the signal from one of the terminals SEn−1, SEn and SEn+1 has a high level, and the signal BSEN is supplied to the transmission gate SW2n as a control input. A MOS transistor 345 is provided to turn OFF the transmission gate SW2n when the output signal of the NOR gate 344 has a low level. The transmission gate SW2n is turned ON only when the signal BSEN has a high level, and the signal from the terminal SEn of the delay control circuit 48 is supplied to the latch circuit 36 as the signal SDn when the transmission gate SW2n is ON.

In other words, as shown in FIG. 22B, only the transmission gates SW1n of the three gate units 342-n-1, 342-n and 342-n+1 of the gate units 342-1 through 342-m are turned ON when the signal from the terminal SEn of the delay control circuit 48 has a high level, and the transmission gates SW1n of the remaining gate units are turned OFF. Hence, since the transmission gates SW1n of the gate unit 342-n corresponding to the terminal SEn which outputs the high-level signal and the gate units 342-n-1 and 342-n+1 which are adjacent to the gate unit 342-n are turned ON, it is possible to supply the signals from the terminals SEn−1, SEn and SEn+1 to the latch circuit 36 when the delay control circuit 48 shifts up or down. In addition, since the transmission gates SWn1 of the remaining gate units are turned OFF, it is possible to reduce a stray capacitance of the gate circuit 36 from the point of view of the signal BSEN.

Figures 23A, 23B:
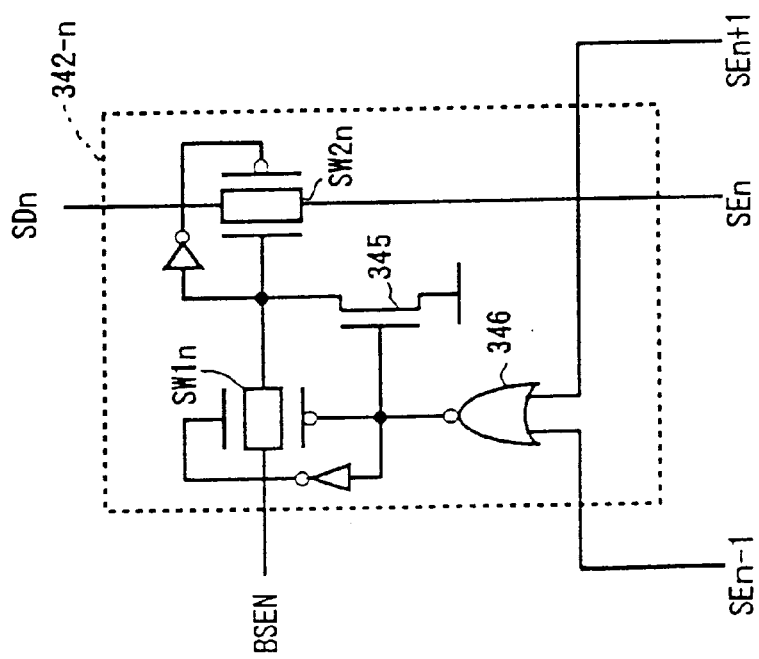
FIGS. 23A and 23B are diagrams for explaining another embodiment of the gate unit.

FIG. 23A is a circuit diagram showing another embodiment of the gate unit 342-n which may be used in the gate circuit 34 shown in FIG. 21, where n is an integer satisfying n=1, . . . , m. The signal from the terminal SEn corresponding to the gate unit 342-n is supplied to a transmission gate SW2n, and the signals from the terminals SEn−1 and SEn+1 adjacent to the terminal SEn are supplied to a NOR gate 346. An output signal of the NOR gate 344 is supplied to a transmission gate SW1n as a control input. The transmission gate SW1n is turned ON when the signal from one of the terminals SEn−1, SEn and SEn+1 has a high level, and the signal BSEN is supplied to the transmission gate SW2n as a control input. A MOS transistor 345 is provided to turn OFF the transmission gate SW2n when the output signal of the NOR gate 346 has a low level. The transmission gate SW2n is turned ON only when the signal BSEN has a high level, and the signal from the terminal SEn of the delay control circuit 48 is supplied to the latch circuit 36 as the signal SDn when the transmission gate SW2n is ON.

In other words, as shown in FIG. 23B, only the transmission gates SW1n of the four gate units 342-n-1, 342-n, 342-n+1 and 342-n+2 of the gate units 342-1 through 342-m are turned ON when the signals from the terminals SEn and SEn+1 of the delay control circuit 48 have a high level, and the transmission gates SW1n of the remaining gate units are turned OFF. Hence, since the transmission gates SW1n of the gate units 342-n and 342-n+1 corresponding to the terminals SEn and SEn+1 which output the high-level signal and the gate units 342-n-1 and 342-n+2 which are respectively adjacent to the gate units 342-n and 342-n+1 are turned ON, it is possible to supply the signals from the terminals SEn−1, SEn, SEn+1 and SEn+2 to the latch circuit 36 when the delay control circuit 48 shifts up or down. In addition, since the transmission gates SWn1 of the remaining gate units are turned OFF, it is possible to reduce a stray capacitance of the gate circuit 36 from the point of view of the signal BSEN.

For the sake of convenience, it is assumed that a ratio of a source-drain capacitance $C_{SD}$ and a gate capacitance $C_G$ of a MOS transistor is 1:2, and that a ratio of a gate width $W_N$ of a NMOS transistor forming a CMOS transistor (for example, inverter or the like) and a gate width $W_P$ of a PMOS transistor forming the CMOS transistor is 1:2. In addition, it is also assumed that a source-drain capacitance $C_{SD}$ of the NMOS transistor is "a". In this case, the stray capacitance from the point of view of the signal BSEN in the gate unit shown in FIG. 20B is 6a at the inverter and 2a at the NMOS transistor of the transmission gate, thereby having a total of 8a, and the stray capacitance is 8am for the gate circuit 36 as a whole. On the other hand, the stray capacitance of the gate units shown in FIGS. 22A and 23A from the point of view of the signal BSEN is 8a when the transmission gate SW1n is ON and is 3a when the transmission gate SW1n is OFF. Hence, in the case of the gate unit shown in FIG. 22A, for example, the stray capacitance is (3m+32)a for the gate circuit 36 as a whole. Since the gate circuit 36 includes several tens of gate units, it may be seen that the stray capacitance from the point of view of the signal BSEN is considerably smaller in the gate units shown in FIGS. 22A and 23A as compared to the gate unit shown in FIG. 20B, and the rise time of the signal BSEN can be increased according to the gate units shown in FIGS. 22A and 23A.

Figure 24:
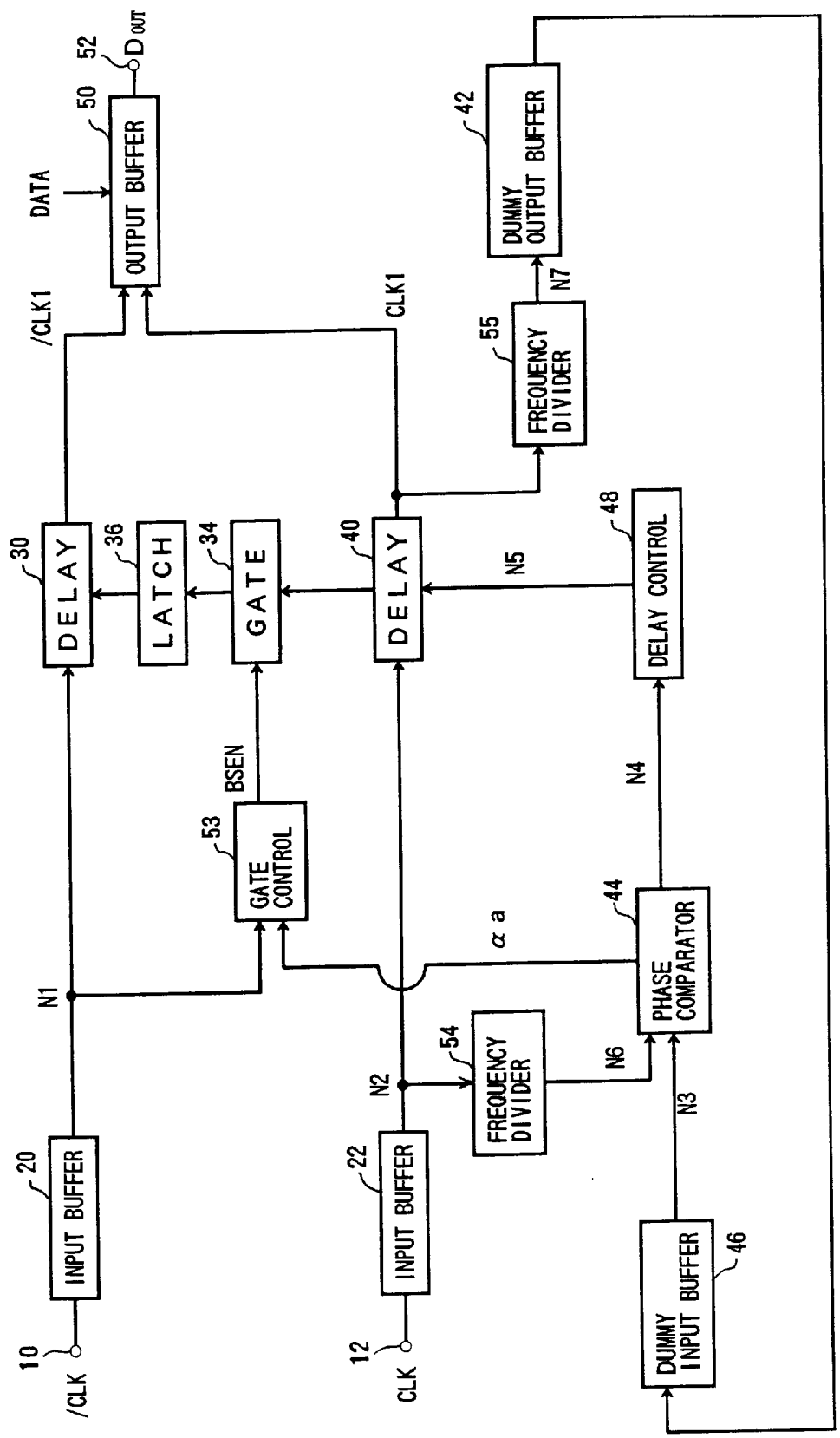
FIG. 24 is a system block diagram showing a second embodiment of the semiconductor integrated circuit device according to the present invention.

FIG. 24 is a system block diagram showing a second embodiment of the semiconductor integrated circuit device according to the present invention. More particularly, FIG. 24 shows a DLL circuit of this second embodiment. In FIG. 24, those parts which are the same as those corresponding parts in FIG. 3 are designated by the same reference numerals.

In FIG. 24, the external clock signals /CLK and CLK having mutually inverted phases are respectively input to the input terminals 10 and 12, and supplied to the delay circuits 30 and 40 via the input buffers 20 and 22. In addition, the external clock signal /CLK output from the input buffer 20 is supplied to a gate control circuit 33, and the external clock signal CLK output from the input buffer 22 is supplied to the phase comparator 44 as a reference clock after being frequency-divided by N in a 1/N frequency divider 54.

The external clock signal CLK output from the input buffer 22 is passed through the delay circuit 40, then frequency-divided by N in a 1/N frequency divider 55, and is further passed through the dummy output buffer 42 and the dummy input buffer 46 and delayed, before being supplied to the phase comparator 44. The dummy output buffer 42 has the same circuit construction as the output buffer 50, and the dummy input buffer 46 has the same circuit construction as the input buffers 20 and 22. The phase comparator 44 compares phases of the clock signal which is delayed by the dummy input buffer 46 and the reference clock (clock signal CLK) from the input buffer 22, and generates a phase error signal at the timing of a rising edge of the clock signal CLK. This phase error signal is supplied to a delay control circuit 48.

The delay control circuit 48 controls the delay quantity of the delay circuit 40 so as to eliminate the phase error by supplying a delay control signal to the delay circuit 40 based on the phase error signal. Hence, the delay quantity of the delay circuit 40 is variably controlled so that the rising edge of the delayed clock signal matches the rising edge of the reference clock, that is, so that the delayed clock signal is delayed by a quantity corresponding to k periods of the external clock signal with respect to the reference clock, where k is an integer greater than or equal to N.

The delay control signal output from the delay control circuit 48 is also supplied to the gate circuit 34 via the delay circuit 40. The gate circuit 34 supplies the delay control signal to the latch circuit 36 under the control of the gate control circuit 53. The delay control signal latched by the latch circuit 36 is supplied to the delay circuit 30. The gate control circuit 53, the gate circuit 34 and the latch circuit 36 form a timing adjusting circuit. In this embodiment, a signal φa which instructs a phase comparing timing is supplied to the gate control circuit 53 from the phase comparator 44. This signal φa is synchronized to the timing at which a signal which is obtained by frequency-dividing the external clock signal CLK by N rises.

The delay circuit 30 has the same construction as the delay circuit 40. A delay quantity of the delay circuit 30 is controlled based on the delay control signal from the latch circuit 36. Hence, the clock signals /CLK and CLK which have mutually inverted phases and are respectively delayed by the delay circuits 30 and 40 are supplied to the output buffer 50.

The DRAM (not shown) which supplies the read data DATA to the output buffer 50 carries out a high-speed access so that an apparent data read speed is doubled by reading the data in synchronism with each of two clock signals having mutually inverted phases. The output buffer 50 carries out a buffering operation with respect to the data on the data bus (not shown), in synchronism with the supplied clock signals /CLK and CLK and outputs the buffered data $D_{OUT}$ via the data output terminal 52.

Figure 25:
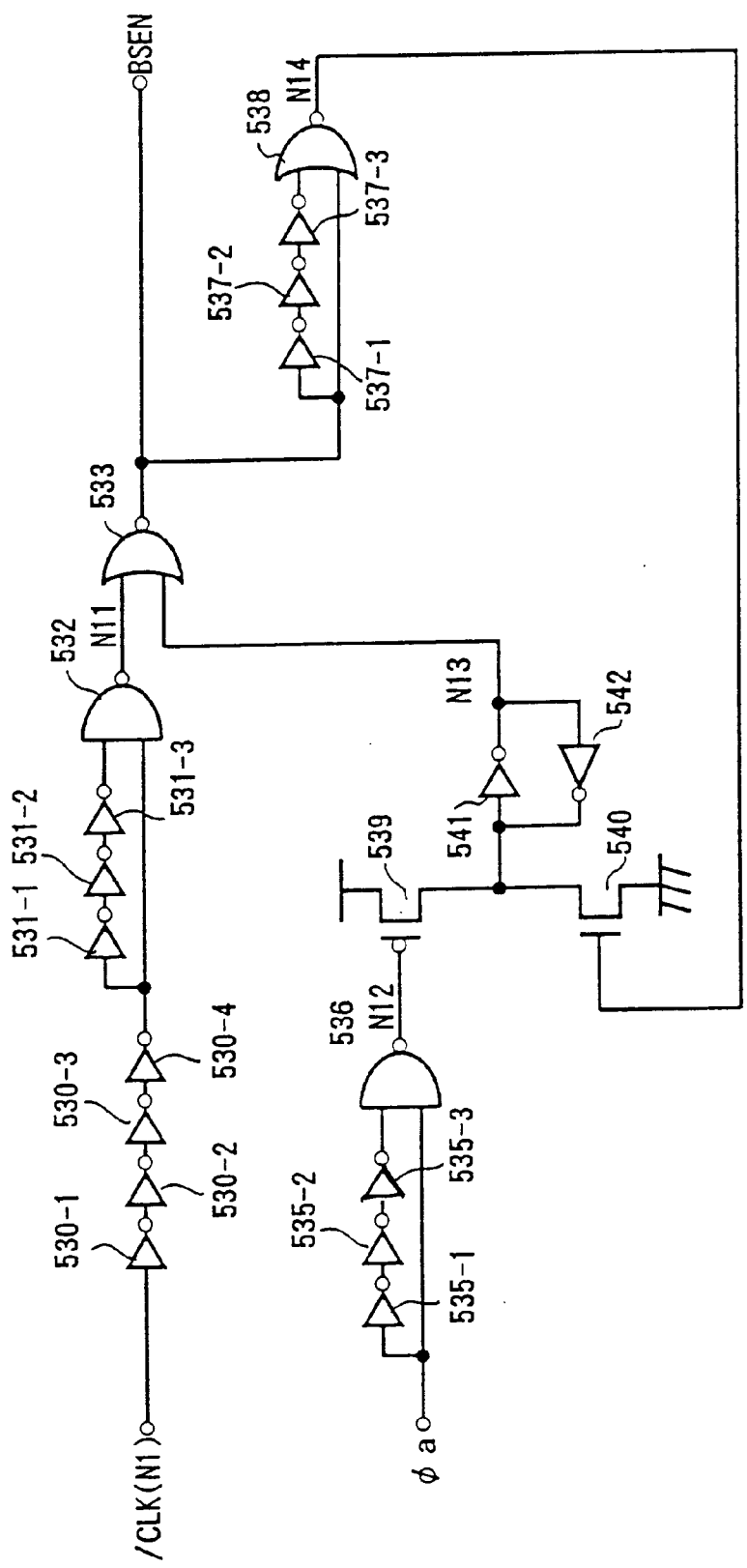
FIG. 25 is a circuit diagram showing an embodiment of a gate control circuit of the second embodiment.

FIG. 25 is a circuit diagram showing an embodiment of the gate control circuit 53. In FIG. 25, the external clock signal /CLK shown in FIG. 26 which is obtained via the input buffer 20 is delayed by a predetermined time by inverters 530-1 through 530-4, and is directly supplied to a NAND gate 532 on one hand, and is supplied the NAND gate 532 via inverters 531-1 through 531-3 after being delayed by a predetermined time on the other. Hence, a signal N11 shown in FIG. 26 is output from the NAND gate 532, and is output via a NOR gate 533.

Figure 26:
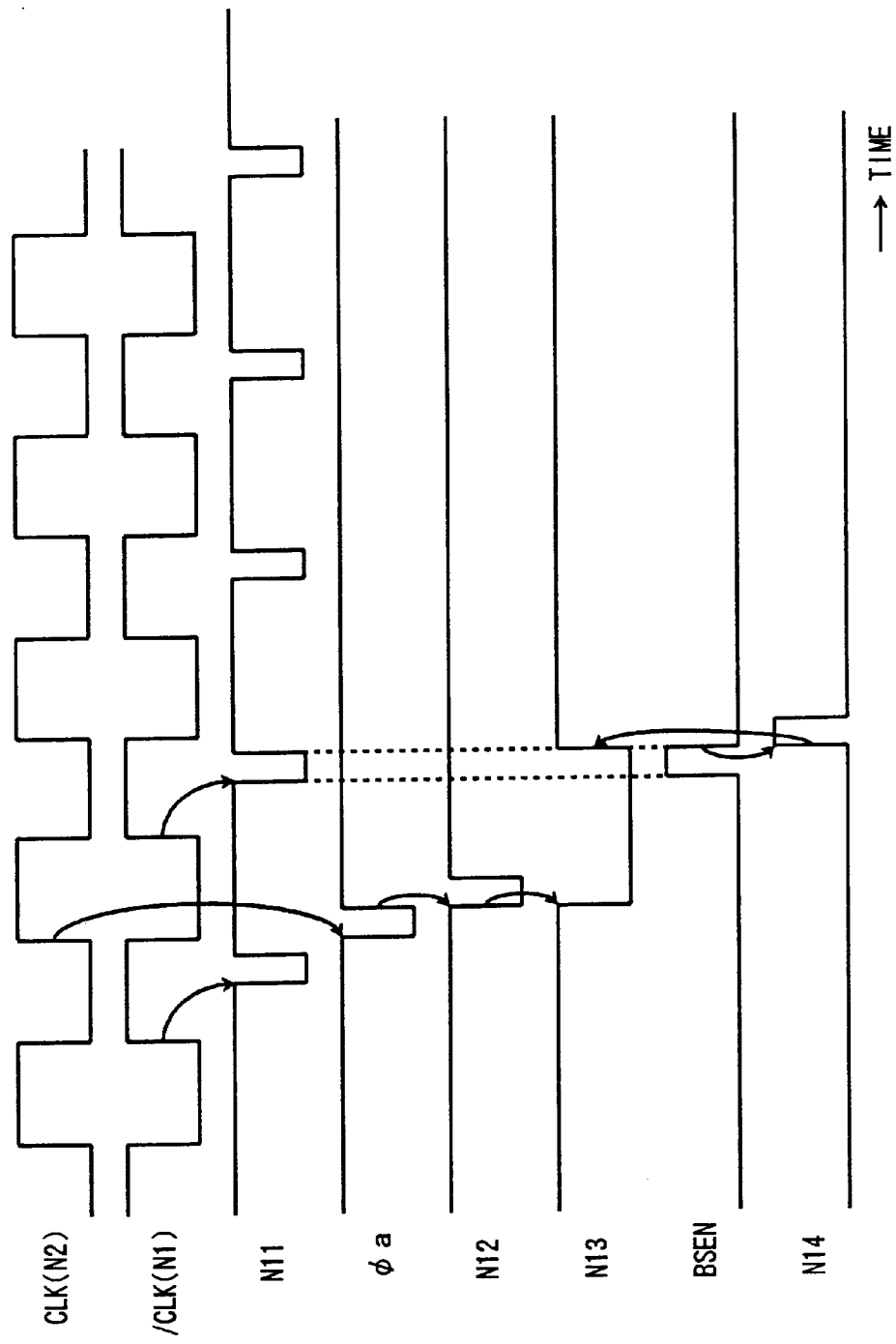
FIG. 26 is a timing chart for explaining the operation of the gate control circuit shown in FIG. 25.

On the other hand, the signal φa shown in FIG. 26 which is synchronized to the timing at which the signal which is obtained by frequency-dividing the external clock signal CLK by N rises, is supplied from the phase comparator 44 to a NAND gate 536 directly on one hand, and to the NAND gate 536 via inverters 535-1 through 535-3 after being delayed by a predetermined time on the other. Hence, a signal N12 shown in FIG. 26 is output from the NAND gate 532. This signal N12 is supplied to a gate of a PMOS transistor 539. An output from a drain of the PMOS transistor 539 is latched by a latch loop which is formed by inverters 541 and 542, and a signal N13 shown in FIG. 26 from the latch loop is supplied to a NOR gate 533. The NOR gate 533 outputs a high-level signal BSEN shown in FIG. 26 which when the signal N11 assumes a low level after the signal N13 assumes a low level.

This signal BSEN is supplied directly to a NAND gate 538 on one hand, and is supplied to the NAND gate 538 via inverters 537-1 through 537-3 after being delayed by a predetermined time. Hence, the NAND gate 538 outputs a signal N14 shown in FIG. 26. This signal N14 is supplied to a gate of a NMOS transistor 540. An output from a drain of the NMOS transistor 540 is latched by the latch loop which is formed by the Inverters 541 and 542, and the signal N13 from the latch loop is supplied to the NOR gate 533. In this case, the signal N13 from the latch loop assumes a high level, and the NOR gate 533 is prohibited from outputting the signal BSEN until the signal φa is thereafter received.

Figure 27:
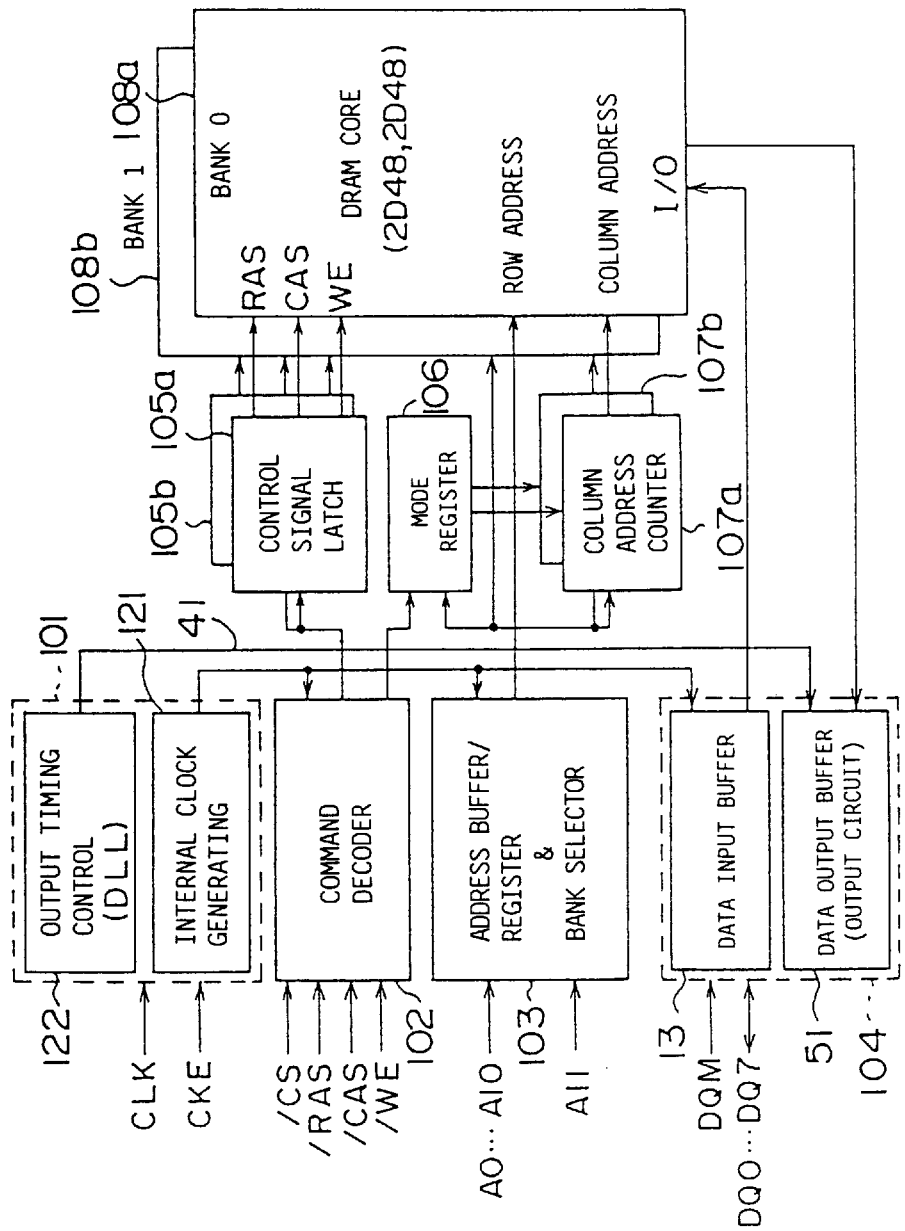
FIG. 27 is a system block diagram showing the construction of a SDRAM to which the semiconductor integrated circuit device according to the present invention may be applied.
Figure 28:
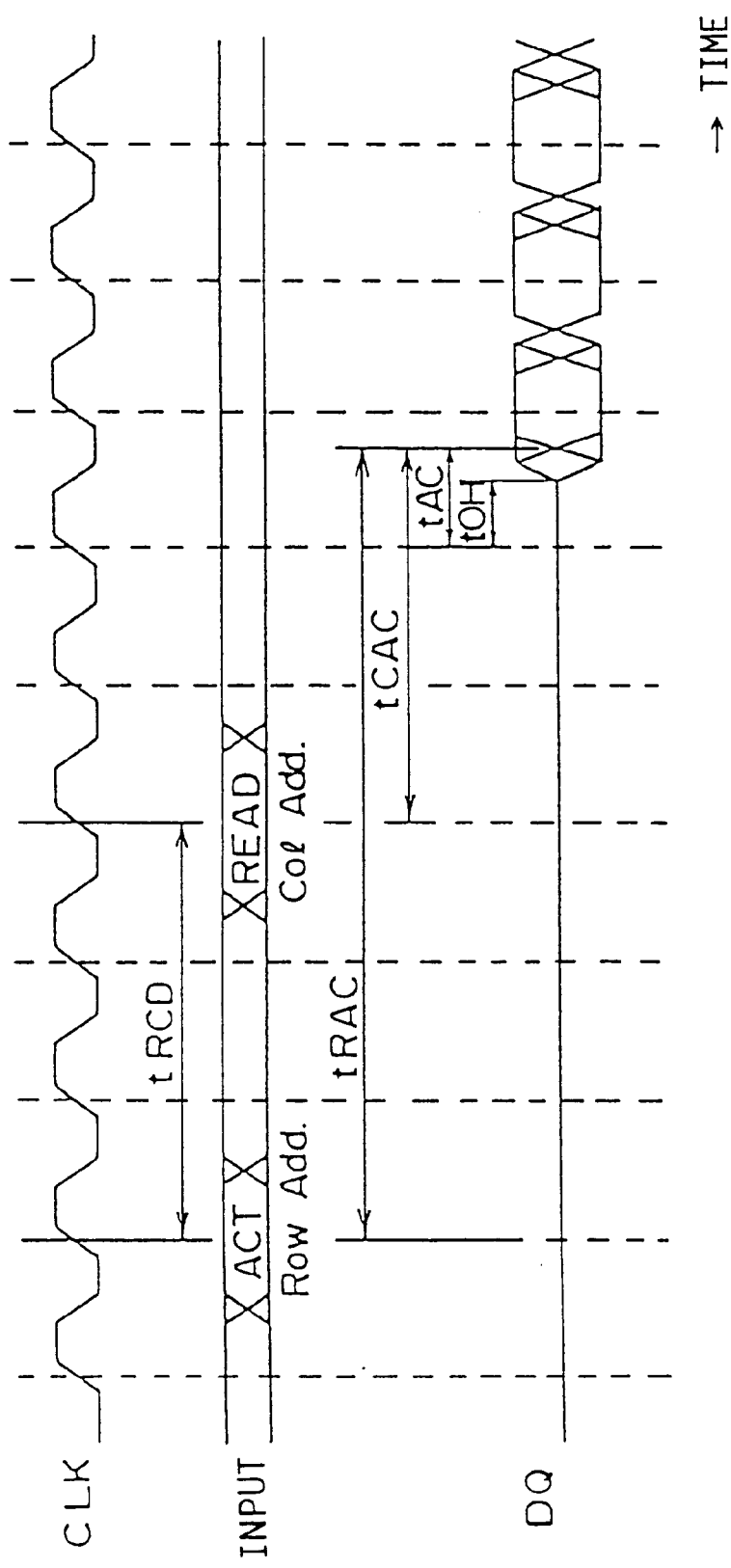
FIG. 28 is a timing chart for explaining the operation of the SDRAM shown in FIG. 27.

FIG. 27 is a system block diagram showing the construction of a Synchronous DRAM (SDRAM) to which the semiconductor integrated circuit device according to the present invention, including the DLL circuit, may be applied. FIG. 28 is a timing chart for explaining the operation of the SDRAM shown in FIG. 27.

For example, the SDRAM shown in FIG. 27 which is applied with the semiconductor integrated circuit device according to the present invention employs a pipeline system, with a structure of 16M×2 banks×8 bit width.

In addition to DRAM cores 108a and 108b of a general purpose DRAM, the SDRAM shown in FIG. 27 includes a clock buffer 101, a command decoder 102, an address buffer/register and bank selector (address buffer) 103, an input/output (I/O) data buffer/register 104, control signal latches 105a and 105b, a mode register 106, and column address counters 107a and 107b. Unlike the operation of a conventional DRAM, an operation mode of the SDRAM is determined by inputting various commands by a combination of a chip select signal /CS, a row address strobe signal /RAS, a column address strobe signal /CAS and a write enable signal /WE supplied to terminals /CS, /RAS, /CAS and /WE. each of the various commands is decoded by the command decoder 102, and various parts of the SDRAM are controlled depending on the operation mode. The command signals /CS, /RAS, /CAS and /WE are also input to the control signal latches 105a and 105b, so as to latch states thereof until a next command arrives.

An address signal made up of bits A0, . . . , A11 is amplified by the address buffer 103 and used as a load address of each bank, and is also used as an initial value for the column address counters 107a and 107b.

The clock buffer 101 includes an internal clock generating circuit 121 and an output timing control circuit 122. The internal clock generating circuit 121 generates normal internal clock signals from the external clock signal CLK. The output timing control circuit 122 generates clock signals which have been subjected to an accurate delay control (phase control) by use of the DLL circuit described above.

The I/O buffer/register 104 includes a data input buffer 13 and a data output buffer (output circuit) 50. A signal read from the DRAM cores 108a and 108b is amplified to a predetermined level by the data output buffer 50, and the data is output via pads DQ0 through DQ7 at a timing dependent on a clock signal from the output timing control circuit 122. In addition, the input data input via the pads DQ0 through DQ7 is read via the data input buffer 13. A clock wiring 41 connects the output timing control circuit 122 and the data output buffer 50.

A read operation of the SDRAM shown in FIG. 27 will now be described with reference to FIG. 28.

First, the external clock signal CLK is supplied to the SDRAM from a system (not shown) which uses the SDRAM. The SDRAM operates so that various commands, an address signal and the input data are input, and the output data are output in synchronism with the rising edge of the external clock signal CLK.

When reading the data from the SDRAM, an active command ACT is input to command terminals by a combination of the command signals /CS, /RAS, /CAS and /WE, and a row address signal is input to the address terminals. The SDRAM is enabled and becomes active when supplied with the command signals and the row address signal. A word line is selected in response to the row address signal, and cell information on the selected word line is output to a bit line and amplified in a sense amplifier circuit (not shown).

After an operation time tRCD of a part related to the row address signal, a read command READ and a column address signal are input to the SDRAM. Based on the column address signal, a selected sense amplifier data is output to a data bus. The data on the data bus is amplified in a data bus amplifier (not shown) and is further amplified in the data output buffer 51, before being output via output terminals DQ. The series of operations of the SDRAM described above is basically the same as that of a general purpose DRAM, but in the case of the SDRAM, the circuit related to the column address signal carries out a pipeline operation, and the read data is output for each clock cycle. For this reason, the data transfer speed corresponds to the period of the external clock signal CLK.

There are three kinds of access times in the SDRAM, and each access time is defined with reference to the timing of the rising edge of the external clock signal CLK. In FIG. 28, tRAC denotes a row address access time, tCAC denotes a column address access time, and tAC denotes a clock access time.

Figure 29:
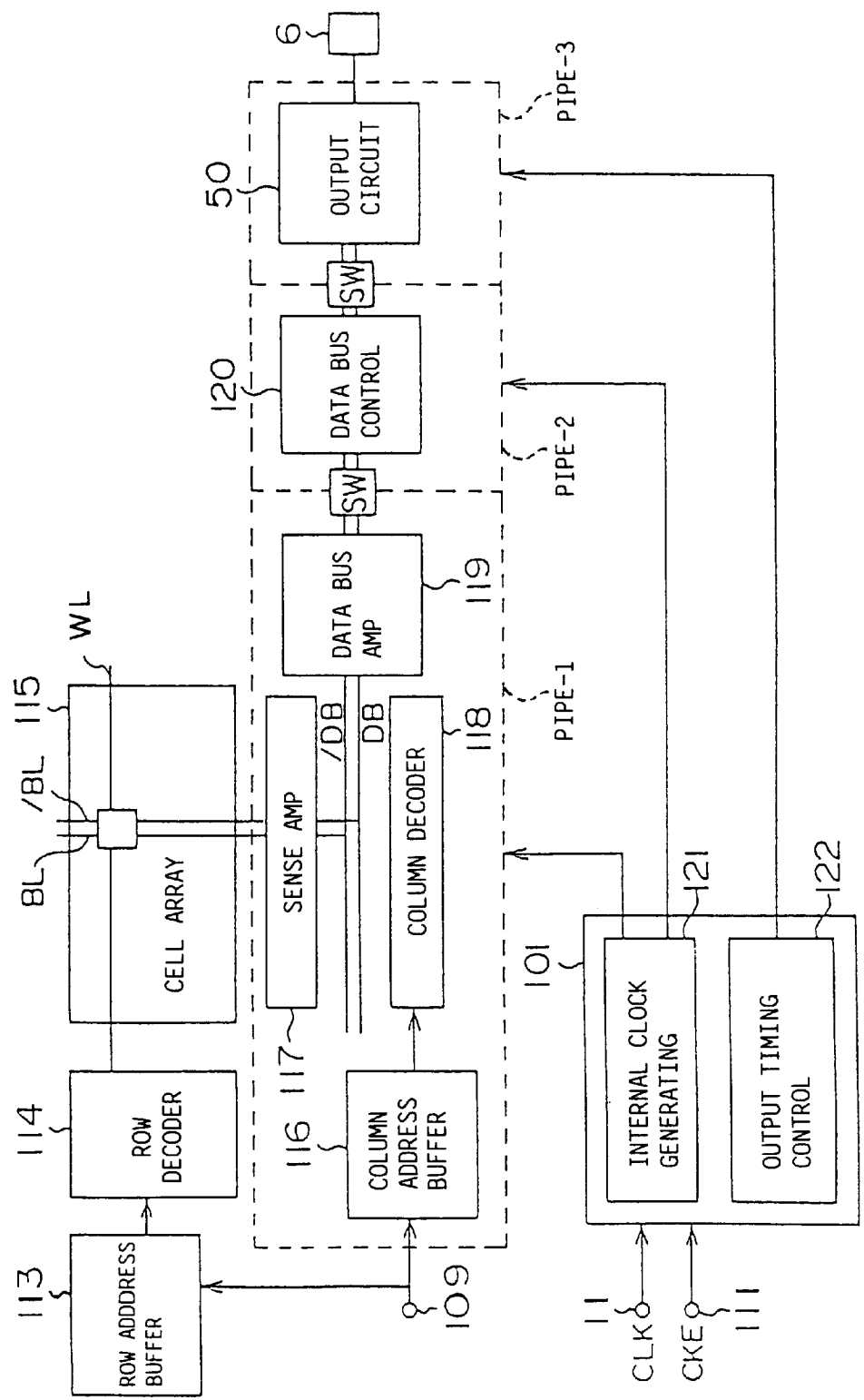
FIG. 29 is a system block diagram generally showing the construction of an important part of the SDRAM shown in FIG. 27.

FIG. 29 is a system block diagram generally showing the construction of an important part of the SDRAM shown in FIG. 27. In order to explain the pipeline operation of the SDRAM, FIG. 29 shows a case where three stages of pipes are provided.

In the SDRAM, a processing circuit related to the column address signal is divided into a plurality of stages along the process flow, and a circuit at each of the divided stages is called a pipe.

In FIG. 29, the clock buffer 101 includes the internal clock generating circuit 121 and the output timing control circuit 122, as described above in conjunction with FIG. 27, and is supplied with clock signals CLK and CKE via input terminals 11 and 111. The output (normal internal clock signal) of the internal clock generating circuit 121 is supplied to pipes PIPE-1 and PIPE-2, and the output (phase controlled internal clock signal) of the output timing control circuit 122 is supplied to the output circuit (data output buffer) 50 of a pipe PIPE-3.

Each pipe is controlled depending on the internal clock signal supplied thereto, and a switch SW is provided between two adjacent pipes to control a transfer timing of signals between the two adjacent pipes. Each switch SW between two adjacent pipes is controlled by the internal clock signal which is generated by the clock buffer 101 (internal clock generating circuit 121).

In the case shown in FIG. 29, a column address buffer 116 in the pipe PIPE-1 amplifies the address signal supplied via an input terminal 109, and supplies the amplified address signal to a column decoder 118, and information of a sense amplifier circuit 117 corresponding to an address selected by the column decoder 118 is output to a data bus DB. The information on the data bus DB is amplified by a data bus amplifier 119.

The sense amplifier circuit 117 is coupled to a cell array 115 which includes bit lines BL and /BL, and word lines WL. A row address buffer 113 which receives the address signal via the input terminal 109 is coupled to the cell array 115 via a row address decoder 114.

In addition, only a data bus control circuit 120 is provided in the pipe PIPE-2, and only an I/O buffer 104 (output circuit 50) is provided in the pipe PIPE-3. The illustration of the data input buffer 13 in the I/O buffer 104 is omitted in FIG. 29.

When the operation of the circuit within each pipe is completed within the clock cycle time, each switch SW provided between two adjacent pipes is opened and closed in synchronism with the clock signal, so as to output the data in a relay format. As a result, the processes in each of the pipes are carried out in parallel, and the data in synchronism with the clock signal is continuously obtained from an output terminal 6.

Figure 30:
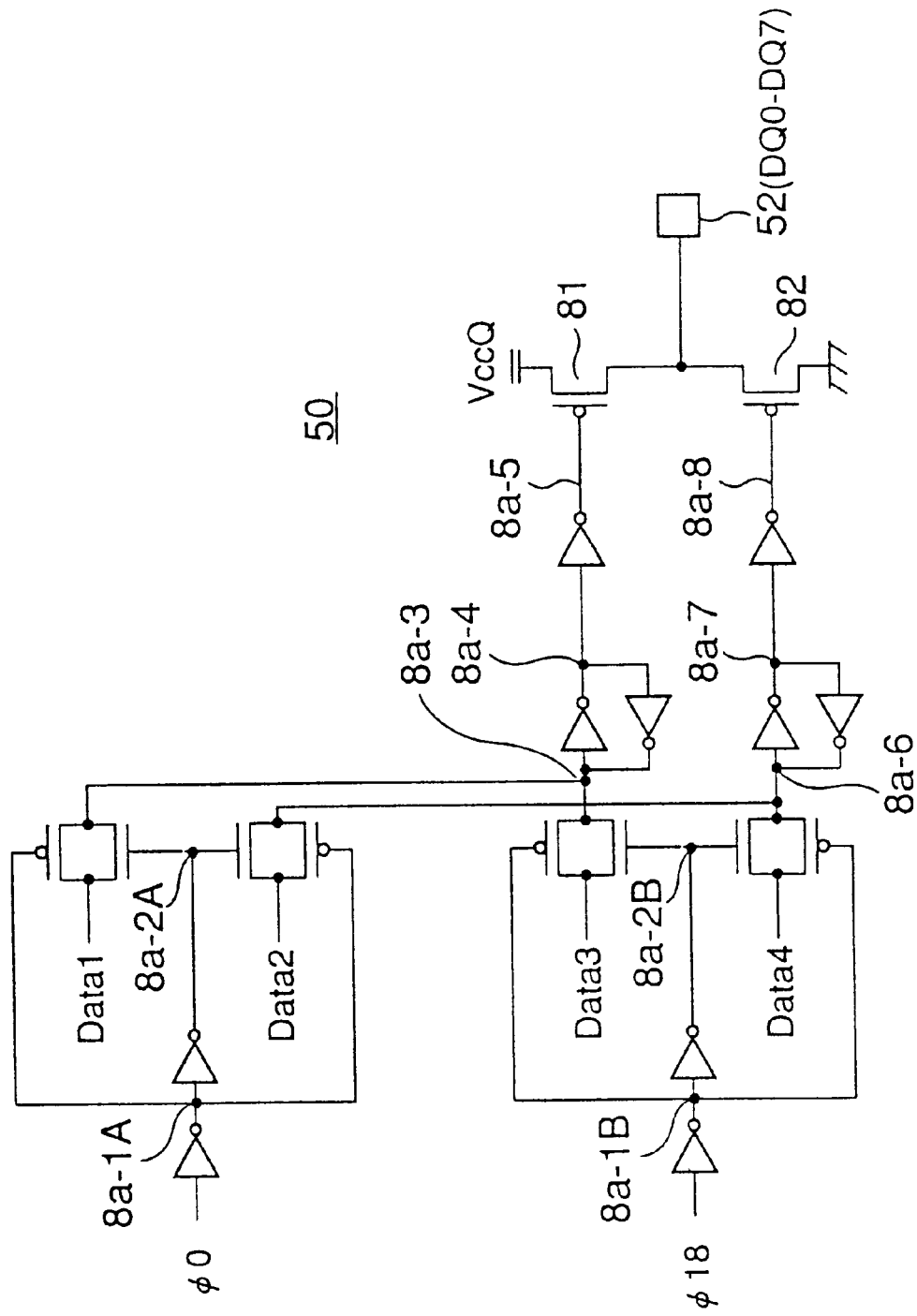
FIG. 30 is a circuit diagram showing en embodiment of an output circuit (data output buffer) of the semiconductor integrated circuit device according to the present invention.

FIG. 30 is a circuit diagram showing en embodiment of the output circuit (data output buffer) 50 of the semiconductor integrated circuit device according to the present invention.

In FIG. 30, data Data1 and Data2 correspond to stored data which are read from the cell array 115 shown in FIG. 29 and output via the sense amplifier circuit 117, the data bus amplifier 119 and the data bus control circuit 120. The data Data1 and Data2 both have a low level when the output data has a high level, and both have a high level when the output data has a low level. The output data may assume a high-impedance state which does not correspond to a high or low level, and in this case, the data Data1 is converted into a high level and the data Data2 is converted into a low level in the data bus control circuit 120. Data Data3 and Data4 are similarly correspond to stored data which are read from the cell array 115 and output via the sense amplifier circuit 117, the data bus amplifier 119 and the data bus control circuit 120. The data Data3 and Data4 both have a low level when the output data has a high level, and both have a high level when the output data has a low level.

A clock signal $\phi 0$ corresponds to the output signal (real clock) of the output timing control circuit 122 (delay circuit 40 shown in FIG. 3), and functions as an enable signal with respect to the output circuit 50.

When the clock signal $\phi 0$ rises to the high level, the information of the data Data1 and Data2 appears at a data output pad 52 (DQ0 through DQ7). For example, when a high-level signal is to be output to the data output pad 52, the clock signal $\phi 0$ makes a transition from the low level to the high level, a node 8a–1A assumes a low signal level, a node 8a–2A assumes a high signal level, and transfer gates are turned ON to transfer the data Data1 and Data2 to corresponding nodes 8a–3 and 8a–6. As a result, a node 8a–5 assumes a low signal level, and a node 8a–8 assumes a high signal level. In addition, an output P-channel transistor 81 turns ON, and an N-channel transistor 82 turns OFF, so that the high-level signal appears at the data output pad 52. On the other hand, when the clock signal φ0 assumes a low level, the transfer gates turn OFF, and the output state up to that point in time is held.

A clock signal φ18 corresponds to the output signal (inverted real clock) of the output timing control circuit 122 (delay circuit 30 shown in FIG. 3), and functions as an enable signal with respect to the output circuit 50. This clock signal φ18 has a phase which differs by 180 with respect to the clock signal φ0.

When the clock signal φ18 rises to the high level, the information of the data Data3 and Data4 appears at the data output pad 52 (DQ0 through DQ7). For example, when a high-level signal is to be output to the data output pad 52, the clock signal φ18 makes a transition from the low level to the high level, a node 8a-1B assumes a low signal level, a node 8a-2B assumes a high signal level, and transfer gates are turned ON to transfer the data Data3 and Data4 to the corresponding nodes 8a-3 and 8a-6. As a result, the node 8a-5 assumes a low signal level, and the node 8a-8 assumes a high signal level. In addition, the output P-channel transistor 81 turns ON, and the N-channel transistor 82 turns OFF, so that the high-level signal appears at the data output pad 52. On the other hand, when the clock signal φ18 assumes a low level, the transfer gates turn OFF, and the output state up to that point in time is held.

In other words, the information of the data Data1 and Data2 is latched and output via the data output pad 52 when the clock signal φ0 rises to the high level. Next, the information of the data Data3 an Data4 is latched and output via the data output pad 52 when the clock signal φ18 rises to the high level.

Of course, in each of the embodiments described above, logic elements which function as delay elements forming the delay circuit are not limited to NAND gates and inverters, and other logic elements such as NOR gates and exclusive-OR (EOR) gates may be used.

In addition, although the present invention is applied to the SDRAM in the embodiments described above, the application of the present invention is of course not limited to the SDRAM. The present invention is applicable to any semiconductor integrated circuit device which outputs an output signal in synchronism with an external input signal.

Moreover, in the embodiments, the delay circuit 40 forms a first delay circuit, and the delay circuit 30 forms a second delay circuit. The dummy output buffer 42 and the dummy input buffer 46 form a dummy circuit. The gate control circuit 32, the gate circuit 34 and the latch circuit 36 form a timing adjusting circuit. The output buffer 50 forms an internal circuit. The frequency divider 54 forms a first frequency divider, and the frequency divider 55 forms a second frequency divider. The transmission gate SWn1 forms a switch.

Further, the present invention is not limited to these embodiments, but various variations and modifications may be made without departing from the scope of the present invention.

What is claimed is:

1. A semiconductor integrated circuit device comprising:

a first delay circuit delaying a first clock signal and outputting an output signal;

a second delay circuit delaying a second clock signal which has an inverted phase with respect to the first clock signal;

a phase comparator outputting a phase error signal based on a comparison of the first clock signal and a feedback signal corresponding to the output signal from said first delay circuit;

a delay control circuit generating a delay control signal based on the phase error signal, said delay control signal being used to variably control a delay quantity of said first delay circuit; and a timing adjusting circuit variably controlling a delay quantity of said second delay circuit at a timing synchronized to the second clock signal responsive to said second clock and delay control signal.

2. The semiconductor integrated circuit device as claimed in claim 1, which further comprises:

a first frequency divider frequency-dividing the first clock signal; and a second frequency divider frequency-dividing the first clock signal which is delayed via said first delay circuit, said phase comparator outputting the phase error signal by comparing output signals of said first and second frequency dividers.

3. The semiconductor integrated circuit device as claimed in claim 2, wherein said timing adjusting circuit comprises:

a gate circuit passing the delay control signal when turned ON in response to a gate control signal;

a gate control circuit generating the gate control signal which controls an ON state of said gate at said timing synchronized to the second clock signal; and a latch circuit latching the delay control signal received via said gate circuit and supplying latched delay control signal to said second delay circuit.

4. The semiconductor integrated circuit device as claimed in claim 1, wherein said timing adjusting circuit comprises:

a gate circuit passing the delay control signal when turned ON in response to a gate control signal;

a gate control circuit generating the gate control signal which controls an ON state of said gate at said timing synchronized to the second clock signal; and a latch circuit latching the delay control signal received via said gate circuit and supplying latched delay control signal to said second delay circuit.

5. The semiconductor integrated circuit device as claimed in claim 4, wherein:

each of said first and second delay circuits includes m unit delay circuits, where m is a natural number, said delay control signal is made up of m bits, instructing certain unit delay circuits to be selected the m unit delay circuits, and said gate circuit includes m gate units.

6. The semiconductor integrated circuit device as claimed in claim 5, wherein said gate circuit includes a switch which supplies the gate control signal only to selected gate units of said m gate units that receive the delay control signal, where the delay control signal instructs certain unit delay circuits to be selected from the m unit delay circuits.

* * * * *